US005923045A

United States Patent [19]

Nihashi et al.

[11] Patent Number: 5,923,045

[45] Date of Patent: Jul. 13, 1999

[54] SEMICONDUCTOR PHOTOCATHODE AND SEMICONDUCTOR PHOTOCATHODE APPARATUS USING THE SAME

[75] Inventors: Tokuaki Nihashi; Minoru Niigaki, both of Hamamatsu, Japan

[73] Assignee: Hamamatsu Photonics K.K., Hamamatsu, Japan

[21] Appl. No.: 08/864,618

[22] Filed: May 28, 1997

[30] Foreign Application Priority Data

May 28, 1996 [JP] Japan .................................. 8-133789

[51] Int. Cl.[6] ................................................ H01L 29/06

[52] U.S. Cl. .............................. 257/10; 257/11; 313/366; 313/542

[58] Field of Search .................................. 257/9, 10, 11, 257/21, 43, 457, 459; 313/366, 367, 542

[56] References Cited

U.S. PATENT DOCUMENTS

| | | | |
|---|---|---|---|
| 3,958,143 | 5/1976 | Bell | 313/94 |
| 4,749,903 | 6/1988 | Munier et al. | 313/366 |
| 4,829,355 | 5/1989 | Munier et al. | 257/10 |
| 5,047,821 | 9/1991 | Costello et al. | 357/30 |

FOREIGN PATENT DOCUMENTS

| | | |
|---|---|---|
| 0 228 323 | 7/1987 | European Pat. Off. . |
| 0 558 308 | 1/1993 | European Pat. Off. . |
| 0 627 756 | 12/1994 | European Pat. Off. . |
| 0 718 865 | 6/1996 | European Pat. Off. . |
| 2 592 217 | 6/1987 | France . |
| 4-269419 | 9/1992 | Japan . |
| 8-153463 | 6/1996 | Japan . |
| 91/14283 | 9/1991 | WIPO . |

OTHER PUBLICATIONS

Patent Abstracts of Japan, vol. 096, No. 010, Oct. 31, 1996 re JP 08 153463 A; Tokuaki.

Patent Abstracts of Japan, vol. 096, No. 010, Oct. 31, 1996 re JP 08 153462 A, Tokuaki.

*Primary Examiner*—Minh Loan Tran

*Attorney, Agent, or Firm*—Pillsbury Madison & Sutro LLP

[57] ABSTRACT

Formed on a semiconductor substrate (10) is a first semiconductor layer (20; light absorbing layer) of p-type which has a first dopant concentration and generates an electron in response to light incident. Formed on the first semiconductor layer (20) is a second semiconductor layer (30; electron transfer layer) of p-type having a second dopant concentration lower than the first dopant concentration. A contact layer (50) forms a pn junction with the p-type second semiconductor layer (30). A surface electrode (80) is formed on and in ohmic contact with the contact layer (50). A third semiconductor layer (40; activation layer) is formed within an opening of the contact layer (50) on the surface of the second semiconductor layer (30). Embedded in the second semiconductor layer (30) is a semiconductor section (60; channel grid) having a third dopant concentration. Thus, the quantum efficiency is improved, while structural pixel separation becomes unnecessary at an open area ratio of 100%, and signal modulation is enabled.

14 Claims, 22 Drawing Sheets

SEMICONDUCTOR PHOTOCATHODE AND SEMICONDUCTOR PHOTOCATHODE APPARATUS USING THE SAME

BACKGROUND OF THE INVENTION

1. Field of the Invention

The present invention relates to a semiconductor photocathode which generates an electron in response to light incident and accelerates and emits thus generated electron with an externally applied voltage, as well as a semiconductor photocathode apparatus using the same.

2. Related Background Art

T.E. photocathode (transferred electron semiconductor photocathode) disclosed in U.S. Pat. No. 3,958,143 is known as an example of photocathodes which forms an electric field with an external applied bias voltage, transfers a photoelectron to its emission surface, and then emits the photoelectron. The operation mechanism of T.E. photocathode is disclosed in several publications. In brief, a Schottky electrode is formed on the whole surface of a III–V semiconductor ($p^-$), and a positive potential is given thereto. Consequently, a gradient electric field is formed within the photocathode, so as to accelerate the photoelectron generated in response to light incident. Thus, the energy level of the photoelectron shifts to an upper conduction band, thereby exceeding the energy barrier of the photocathode surface so as to be emitted into the vacuum. It has been confirmed that the T.E. photocathode can effectively respond to light having a wavelength as short as 2.1 μm. Also, in this semiconductor photocathode, the efficiency of photoelectric conversion can be improved when the Schottky electrode is formed like a grid.

On the other hand, U.S. Pat. No. 5,047,821 and Japanese Patent Application Laid-Open No. 4-269419 disclose techniques for constantly making semiconductor photocathodes with a favorable reproducibility.

The quantum efficiency of these semiconductor photocathodes is about 0.1%, which is lower than that of typical photodetectors. In order to be used as a practical photodetector, it is desirable for the semiconductor photocathode to have a higher quantum efficiency. Such a low quantum efficiency is supposed to be due to the fact that photoelectrons are captured with a low efficiency by the Schottky electrode formed on the surface.

In view of the foregoing problems, it is an object of the present invention to provide a semiconductor photocathode which can further improve the quantum efficiency.

It is another object of the present invention to provide a semiconductor photocathode apparatus using such a semiconductor photocathode.

SUMMARY OF THE INVENTION

The present invention is directed to a semiconductor photocathode and semiconductor photocathode apparatus (photodetector tube, imaging tube, photomultiplier, streak camera, image intensifier, and the like) which, with an externally applied voltage, accelerates and emits an electron generated in response to light incident.

In the present invention, the semiconductor photocathode, which, with an externally applied voltage, accelerates and emits an electron generated in response to light incident, comprises a first semiconductor layer of p-type; a second semiconductor layer of p-type formed on the first semiconductor layer; a contact layer formed over the exposed surface of the second semiconductor layer with an opening in the surface thereof to provide a pn junction with the second semiconductor layer; a surface electrode disposed on and in ohmic contact with the contact layer; a third semiconductor layer formed within the opening of the contact layer to cover the remaining exposed surface of the second semiconductor layer and having a lower work function than the second semiconductor layer; and a semiconductor section disposed within the second semiconductor layer directly below the contact layer, and having an wider energy band gap than the second semiconductor layer.

According to this, first, in response to light or electromagnetic wave incident on the p-type first semiconductor layer, a hole-electron pair is generated in this layer. Here, the electron is excited to the lowest energy level (first energy level) of the gamma valley of the conduction band. Since a potential higher than that of the first conductive layer is given to the contact layer forming the pn junction, the generated electron runs toward the contact layer by a force acting in the electric field with this potential. When the dopant concentration of the second semiconductor layer is lower than that of the first semiconductor layer, a depletion region is generated broader in the second semiconductor layer than in the first conductive layer. An electric field is generated in this depletion region, and the running electron is accelerated in this electric field so as to receive an energy. Accordingly, the electron runs toward the contact layer, while being excited to a higher energy level (second energy level) in an upper satellite valley (L or X valley) higher than the lowest energy level of the gamma valley in the conduction band or in the gamma valley.

On the other hand, within the second semiconductor layer, since the semiconductor section is disposed directly below the contact layer while having a wider energy band gap than the second semiconductor layer, a potential barrier is generated due to the existence of this semiconductor section. As the orbit of the running electron is bent by this potential, the electron runs toward the opening of the contact layer. Since the third semiconductor layer is formed within this opening, the electron is introduced into the third semiconductor layer. Since the work function of the third semiconductor layer is lower than that of the second semiconductor layer, the electron is easily emitted from the third semiconductor layer into the vacuum. Preferably, the third semiconductor layer is constituted by a compound semiconductor mainly composed of an alkali metal having a low work function. Examples of material for the third semiconductor layer include combinations of Cs—O, Cs—I, Cs—Te, Sb—Cs, Sb—Rb—Cs, Sb—K—Cs, Sb—Na—K, Sb—Na—K—Cs, and Ag—O—Cs.

Also, in the present invention, the semiconductor photocathode, which, with an externally applied voltage, accelerates and emits an electron generated in response to light incident, may comprise a first semiconductor layer of p-type; a second semiconductor layer of p-type formed on the first semiconductor layer; a semiconductor section formed partially over the exposed surface of the second semiconductor layer and having a wider energy band gap than the second semiconductor layer; a contact layer covering the exposed surface of the semiconductor section with an opening in the surface thereof to provide a pn junction with the semiconductor section; a surface electrode disposed on and in ohmic contact with the contact layer; and a third semiconductor layer formed over the remaining surface of the second semiconductor layer within the opening and having a lower work function than the second semiconductor layer.

According to this, on the surface of the second semiconductor layer, the semiconductor section having a wider energy band gap than the second semiconductor layer is disposed, while the third semiconductor layer is formed on the second semiconductor layer within the opening of the contact layer. Accordingly, a potential barrier is generated due to the existence of this semiconductor section. As the orbit of the running electron is bent so as to bypass the potential barrier, the electron runs toward the opening of the contact layer. Then, the electron is introduced into the third semiconductor layer. Since the work function of the third semiconductor layer is lower than that of the second semiconductor layer, the electron is easily emitted from the third semiconductor layer into the vacuum. Preferably, the third semiconductor layer is constituted by a compound semiconductor mainly composed of an alkali metal having a low work function as described above.

In the present invention, the semiconductor section may have a toroidal portion with which an area enclosed is smaller than the area within the opening of the contact layer.

In this configuration, the electron flow is bent by the toroidal semiconductor layer so as to be converged on the opening without being absorbed by the contact layer.

Also, in the present invention, the semiconductor section may have a mesh form.

In this configuration, the electron is emitted from the surface of the third semiconductor layer with a high homogeneity.

Also, in the present invention, the second semiconductor layer may have, near its interface with the first semiconductor layer, a first graded layer with an energy band gap whose width is between the width of energy band gap of a region on the third semiconductor layer side in the second semiconductor layer and the width of energy band gap of the first semiconductor layer.

When such a first graded layer is provided, the crystal lattice alignment at the interface between the first and second semiconductor layers is favorably kept, whereby the leak current and recombination current can be reduced.

Also, in the present invention, the semiconductor section may include a semiconductor portion arranged in a stripe form.

In this configuration, the electron can be emitted from the surface of the third semiconductor layer with a high homogeneity. Further, the semiconductor section may have semiconductor portions intersecting with each other.

Also, the present invention provides a semiconductor photocathode apparatus comprising a semiconductor photocathode and an anode within a sealed container whose inside is kept at a lower pressure than the atmospheric pressure, wherein the semiconductor photocathode comprises: (a) a semiconductor substrate; (b) a first semiconductor layer of p-type formed on the semiconductor substrate; (c) a second semiconductor layer of p-type formed on the first semiconductor layer; (d) a contact layer formed over the exposed surface of the second semiconductor layer with an opening in the surface thereof to provide a pn junction with the second semiconductor layer; (e) a surface electrode disposed on and in ohmic contact with the contact layer; (f) a third semiconductor layer formed within the opening of the contact layer to cover the remaining exposed surface of the second semiconductor layer and having a lower work function than the second semiconductor layer; (g) a semiconductor section disposed within the second semiconductor layer directly below the contact layer and having a wider energy band gap than the second semiconductor layer; (h) a first connecting pin electrically connected to the surface electrode and penetrating through the sealed container; and (i) a second connecting pin electrically connected to the semiconductor substrate or first semiconductor layer and penetrating through the sealed container; whereas the anode has a third connecting pin electrically connected to the anode and penetrating through the sealed container.

This semiconductor photocathode apparatus is used in a state where a voltage is applied between the first and second connecting pins and between the second and third connecting pins such that the potential of the first connecting pin is higher than that of the second connecting pin and that of the third connecting pin is higher than that of the first connecting pin. In this state, the electron emitted from the above-mentioned semiconductor photocathode is collected by the anode. Accordingly, the current corresponding to the incident light or electromagnetic wave can be taken out from the third connecting pin connected to the anode.

Also, in the present invention, the first semiconductor layer may include, near its interface with the semiconductor substrate, a second graded layer with an energy band gap whose width is between the width of energy band gap of a region on the second semiconductor layer side in the first semiconductor layer and the width of energy band gap of the semiconductor substrate.

When such a second graded layer is provided, the crystal lattice alignment at the interface between the semiconductor substrate and the first semiconductor layer is favorably kept, whereby the leak current and recombination current can be reduced.

Also, the semiconductor photocathode apparatus in accordance with the present invention may further comprise an electron multiplier tube disposed between the semiconductor photocathode and the anode.

In this configuration, the photoelectron from the semiconductor photocathode can be amplified. For example, a dynode or microchannel plate (MCP) may be disposed.

Also, the anode may include a member containing a fluorescent material.

In this case, the anode generates fluorescence as a photoelectron reaches there.

Also, the present invention provides a semiconductor photocathode apparatus comprising a semiconductor photocathode and an anode within a sealed container whose inside is kept at a lower pressure than the atmospheric pressure, wherein the semiconductor photocathode comprises: (a) a semiconductor substrate; (b) a first semiconductor layer of p-type formed on the semiconductor substrate; (c) a second semiconductor layer of p-type formed on the first semiconductor layer; (d) a contact layer disposed between the second semiconductor layer and the anode; (e) a surface electrode disposed on and in ohmic contact with the contact layer; (f) a third semiconductor layer disposed between the second semiconductor layer and the anode and having a lower work function than the second semiconductor layer; (g) a semiconductor section disposed within the second semiconductor layer directly below the contact layer to provide a pn junction with the contact layer, and having a wider energy band gap than the second semiconductor layer; (h) a first connecting pin electrically connected to the surface electrode and penetrating through the sealed container; and (i) a second connecting pin electrically connected to the semiconductor substrate or first semiconductor layer and penetrating through the sealed container; whereas the anode has a third connecting pin electrically connected to the anode and penetrating through the sealed container.

Such a semiconductor photocathode apparatus is used in a state where a voltage is applied between the first and second connecting pins and between the second and third connecting pins such that the potential of the first connecting pin is higher than that of the second connecting pin and that of the third connecting pin is higher than that of the first connecting pin. Consequently, the electron emitted from the semiconductor photocathode is collected by the anode. Accordingly, the current corresponding to the incident light or electromagnetic wave can be taken out from the third connecting pin connected to the anode.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

In the following, embodiments of the semiconductor photocathode in accordance with the present invention will be explained with reference to the attached drawings. Here, constituents identical to each other will be referred to with marks identical to each other, without their overlapping explanations repeated.

(First Embodiment)

Figure 1:
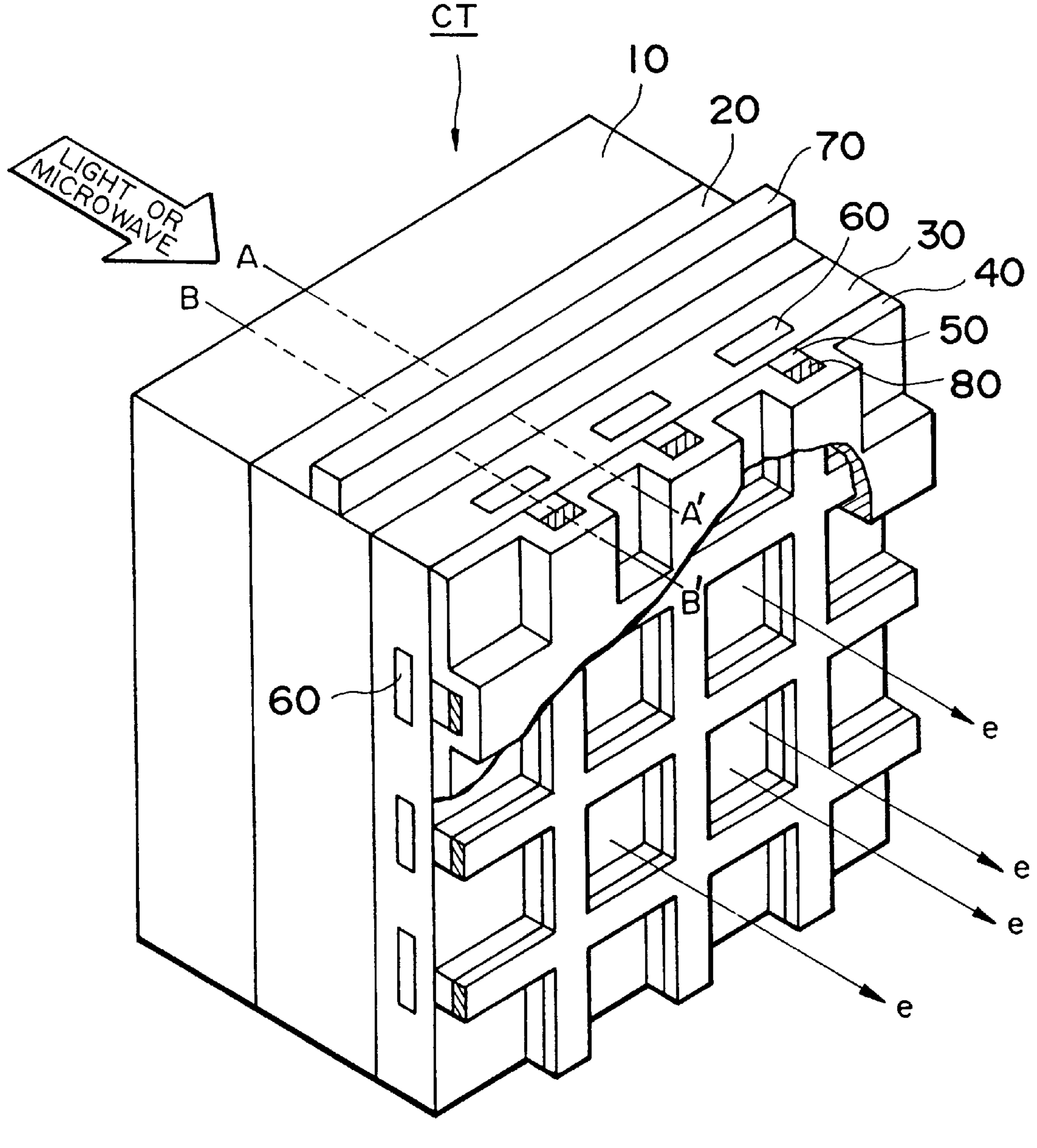
FIG. 1 is a perspective view showing a semiconductor photocathode CT in accordance with a first embodiment.

FIG. 1 is a perspective view showing a semiconductor photocathode CT in accordance with a first embodiment. In the semiconductor photocathode CT, initially formed on a semiconductor substrate 10 is a first semiconductor layer 20 (light absorbing layer) of p-type which generates an electron in response to light or electromagnetic wave incident. The first semiconductor layer 20 has a first dopant concentration. Formed on the first semiconductor layer 20 is a second semiconductor layer 30 (electron transfer layer) of p-type having a second dopant concentration lower than the first dopant concentration. A mesh- or grid-shaped contact layer 50 having an opening is formed so as to cover the surface of the second semiconductor layer 30. Disposed on the contact layer 50 is a surface electrode 80 in ohmic contact therewith.

Also, a third semiconductor layer 40 (activation layer) is formed within the opening of the contact layer 50 on the remaining exposed surface of the second semiconductor layer 30. The third semiconductor layer 40 has a lower work function than the second semiconductor layer 30. Embedded in the second semiconductor layer 30 is a semiconductor section 60 (channel grid) having a third dopant concentration which is about the same as or lower than the second dopant concentration. The semiconductor section 60 is disposed directly below the contact layer 50, i.e., on an extension of a line penetrating through the contact layer 50 in its thickness direction.

Here, the semiconductor section 60 has a mesh- or grid-like form, whereas the area enclosed with a toroidal portion defined by one piece of grid is smaller than the area of the opening of the contact layer 50. Here, the form of the semiconductor section 60 corresponds to the form of the contact layer 50. Accordingly, the electron is efficiently turned toward the opening by the semiconductor section 60 and, since the semiconductor section 60 has a grid-like form, the electron is emitted from the surface of the third semiconductor layer 40 with a high homogeneity. Here, the p-type first conductive layer 20 is provided with an ohmic electrode 70.

In this embodiment, the materials and thickness values of the foregoing semiconductor layers are set as follows.

The semiconductor substrate 10 is a (100) p-type InP substrate. The first semiconductor layer 20 is a p-type InGaAs semiconductor formed on the semiconductor substrate 10 by epitaxial growth and has a dopant concentration of $1\times10^{18}$ to $10^{20}$/cm$^3$. The first semiconductor layer 20 suitably has a thickness defined by the electronic diffusion length of this layer (e.g., 1.5 to 2.5 $\mu$m). The second semiconductor layer 30 is a p-type InP semiconductor having a thickness of 0.1 to 10 $\mu$m and a dopant concentration of about $1\times10^{17}$/cm$^3$. The semiconductor section 60 is a p-type AlAsSb semiconductor having a dopant concentration of $1\times10^{16}$/cm$^3$ or less. The third semiconductor layer 40 is a (Cs.O) semiconductor having a lower work function than the p-type second semiconductor layer 30.

As the material for the third semiconductor layer, a combination of Cs—O, Cs—I, Cs—Te, Sb—Cs, Sb—Rb—Cs, Sb—K—Cs, Sb—Na—K, Sb—Na—K—Cs, Ag—O—Cs, or the like can be used. As the materials of these semiconductor layers, those listed in the following may selectively be used as well. The combination of materials constituting the semiconductor substrate 10, p-type first semiconductor layer 20 (light absorbing layer), p-type second semiconductor layer 30 (electron transfer layer), and semiconductor section 60 (channel grid) is suitably made of those establishing lattice alignment therebetween, preferably, such that the difference in lattice alignment between the layers is within ±0.3%. Table 1 shows the combinations of the constituent materials satisfying this condition. Here, a thin semiconductor film formed on a predetermined substrate may also be used as the semiconductor substrate. When such a substrate is used, the substrate can be used as a support material for the thin film. For example, when a GaN-or AlN-type material is used as the semiconductor layer, sapphire, SiC, spinel, or the like is preferably used as the substrate.

TABLE 1

Combinations of the constituent materials

| substrate | 1st layer | 2nd layer | semiconductor section |
|---|---|---|---|
| GaAs | Ge | GaAs | ZnSe |
| ZnSe | Ge | GaAs | ZnSe |
| GaAs | Ge | Ge | GaAs |
| ZnSe | Ge | Ge | GaAs |

TABLE 1-continued

Combinations of the constituent materials

| substrate | 1st layer | 2nd layer | semiconductor section |
|---|---|---|---|
| GaAs | GaAs | GaAs | ZnSe |
| ZnSe | GaAs | GaAs | ZnSe |
| GaAs | Ge | Ge | ZnSe |
| ZnSe | Ge | Ge | ZnSe |
| InP | InGaAs | InP | AlAsSb |
| InP | InGaAsP | InP | AlAsSb |
| InP | InGaAs | InP | CdS |
| InP | InGaAsP | InP | CdS |
| GaAs | Ge | GaAs | AlAs |
| GaP | Si | GaP | AlP |
| GaSb | InAsSb | GaSb | AlSb |
| GaSb | InGaAsSb | GaSb | AlSb |
| GaSb | InAsSb | GaSb | ZnTe |
| GaSb | InGaAsSb | GaSb | ZnTe |
| GaSb | InAs | GaSb | AlSb |
| GaSb | InAsSb | GaSb | ZnTe |
| GaSb | InGaAsSb | GaSb | ZnTe |
| GaSb | InAs | GaSb | ZnTe |
| GaN | InGaN | GaN | GaAlN |
| GaN | InGaAlN | GaN | GaAlN |
| AlN | GaN | GaAlN | AlN |

In the following, the operation of the semiconductor photocathode CT will be explained.

Figure 2:
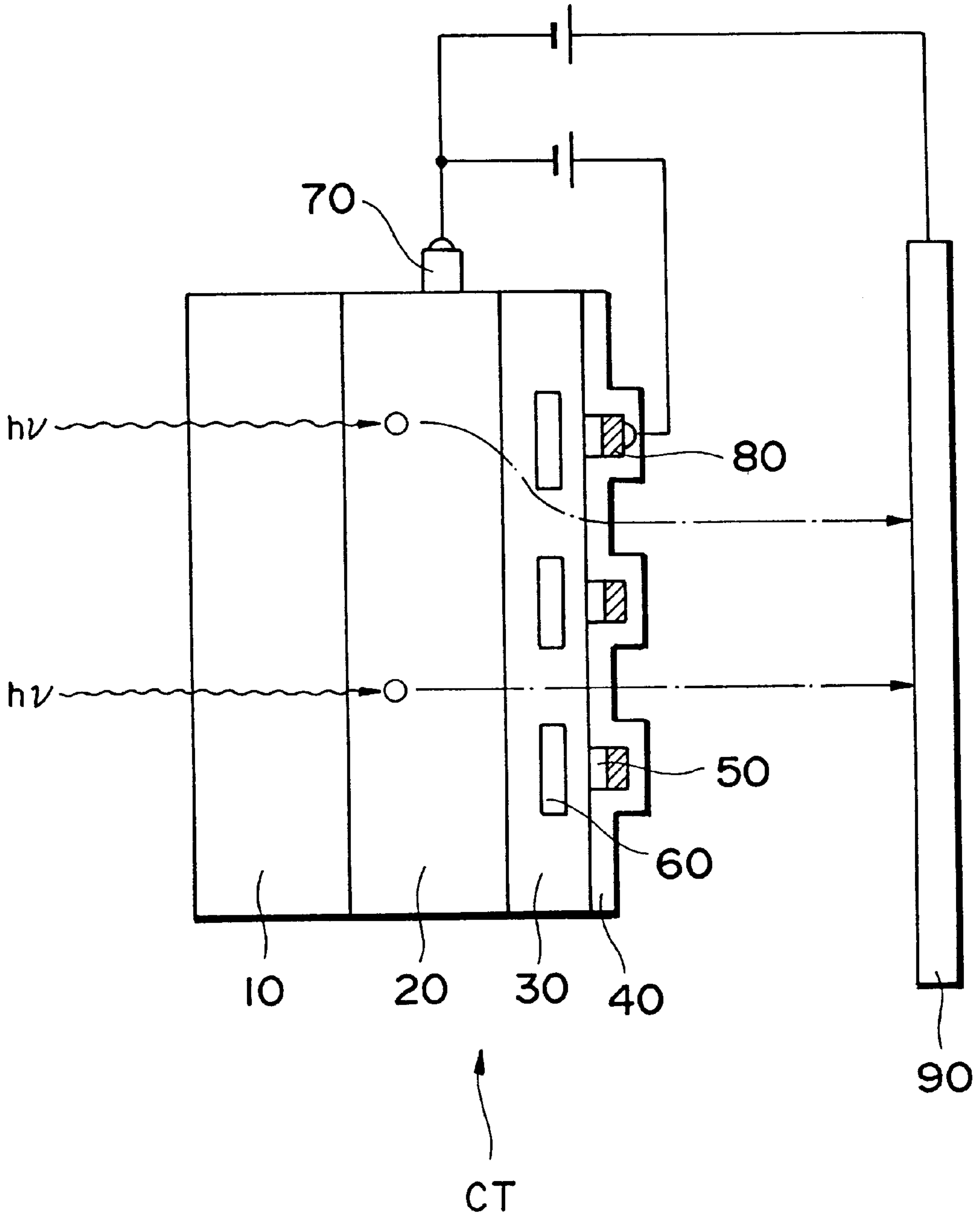
FIG. 2 is a cross-sectional view of the semiconductor photocathode CT taken along line A–A' of FIG. 1.

FIG. 2 is a cross-sectional view of the semiconductor photocathode CT taken along line A–A' of FIG. 1. FIG. 2 also shows an anode 90 disposed so as to oppose to the third semiconductor layer 40. As depicted, a voltage (e.g., 3.5 V) is applied between the ohmic electrode 70 and the surface electrode 80 such that the surface electrode 80 has a potential higher than that of the ohmic electrode 70. Also, a voltage (e.g., 100 V) is applied between the ohmic electrode 70 and the anode 90 such that the anode 90 has a potential higher than that of the ohmic electrode 70. Here, the photocathode CT and the anode 90 are placed in the environment with a pressure of $10^{-10}$ torr or less. From the viewpoint of electron emission, the pressure of the environment where the photocathode CT and the anode 90 are placed should not be higher than the atmospheric pressure and is preferably not higher than $10^{-5}$ torr.

When light or electromagnetic wave enters the photocathode CT under such a condition, a hole-electron pair is generated in the p-type first semiconductor layer 20 in response to the light or electromagnetic wave incident on this layer. Here, the electron is excited to the lowest energy level (first energy level) of the gamma valley of the conduction band. Since the surface electrode 80 is provided with a higher potential than the first semiconductor layer 20, the electron runs toward the contact layer 50 potential higher than that of the first semiconductor layer 20,the electron runs toward the contact layer 50 by a force acting in the resulting electric field. Since the second semiconductor layer 30 has a lower dopant concentration than the first semiconductor layer 20, an electric field stronger than that of the first semiconductor layer 20 is generated in the second semiconductor layer 30. Due to this electric field, the running electron receives an energy so as to be excited to a higher energy level (second energy level) in an upper satellite valley (L or X valley) higher than the lowest energy level of the gamma valley in the conduction band or in the gamma valley, and further runs toward the contact layer 50.

Here, since the semiconductor section 60 having the third dopant concentration is embedded in the second semiconductor layer 30 directly below the contact layer 50, the orbit of the running electron is bent by the potential barrier generated due to the existence of the semiconductor section 60, whereby the electron runs toward the opening of the contact layer 50. Since the third semiconductor layer 40 is formed within the opening of the contact layer 50, the electron is introduced into the third semiconductor layer 40. Since the work function of the third semiconductor layer 40 is lower than that of the second semiconductor layer 30, the electron is easily emitted from the third semiconductor layer 40 into the vacuum. Thus emitted electron advances toward the anode 90 while receiving a force directed to the anode 90.

In the following, the running behaviors of electrons in the photocathode CT will be explained with reference to energy band charts.

Figure 3A:
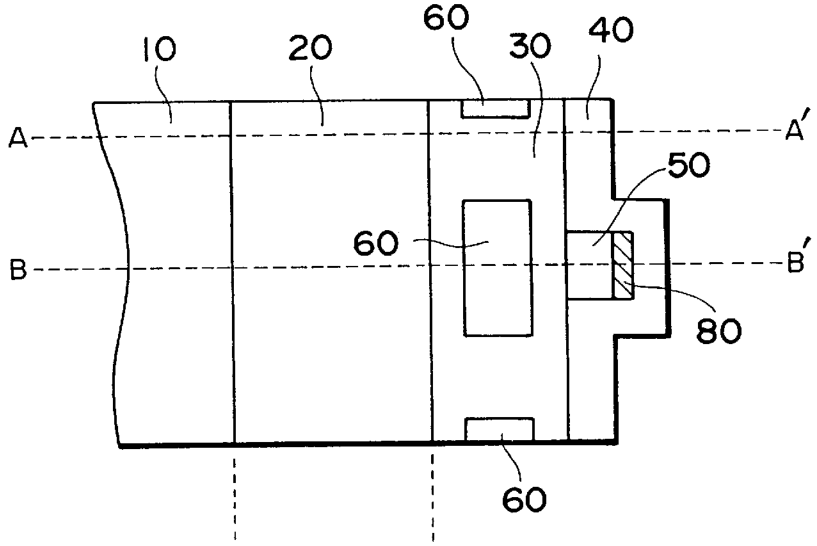
FIG. 3A is an enlarged cross-sectional view of the semiconductor photocathode CT including lines A–A' and B–B' of FIG. 1.
Figure 3B:
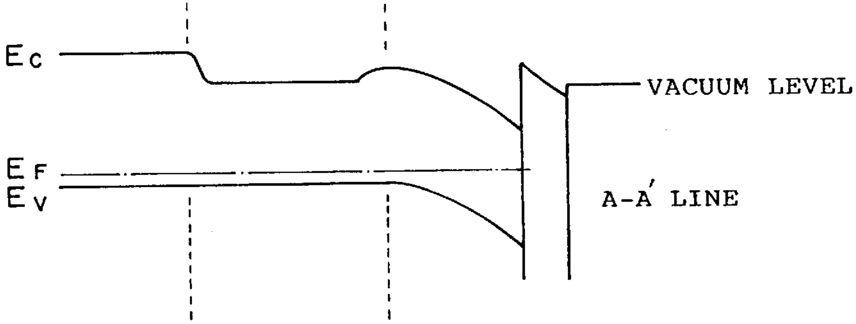
FIGS. 3B and 3C are energy band charts respectively taken along lines A–A' and B–B' of FIG. 3A in the case where no bias is applied to the semiconductor photocathode CT.
Figure 3C:
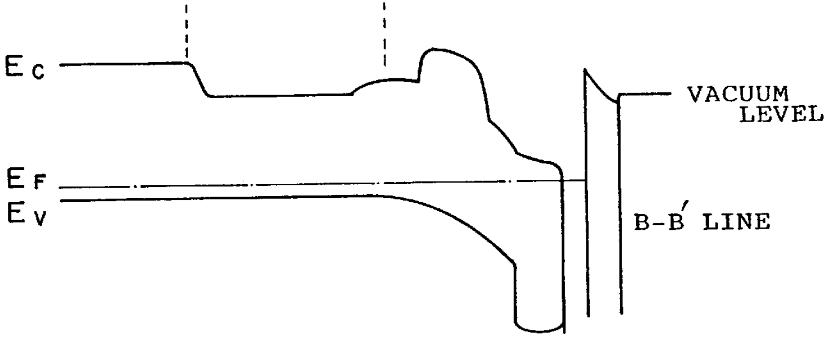

FIG. 3A is an enlarged cross-sectional view of a portion of the photocathode CT including lines A–A' and B–B' of FIG. 1. FIGS. 3B and 3C are energy band charts respectively taken along lines A–A' and B–B' of FIG. 3A in the case where no bias is applied to the photocathode CT.

As can be seen from FIGS. 3A to 3C, since the semiconductor section 60 has a wider energy band gap than the second semiconductor layer 30, the energy level at the lower edge of a conduction band $E_C$ of the semiconductor section 60 is shifted in the positive direction (the potential is shifted in the negative direction) as compared with that of the p-type second semiconductor layer 30, a potential barrier (see FIG. 3C) restraining the excited electron from advancing toward the contact layer 50 is formed within the photocathode CT.

In the following, behaviors of electrons in the case where a bias is applied to the photocathode CT will be explained with reference to FIGS. 4A to 4C.

Figure 4A:
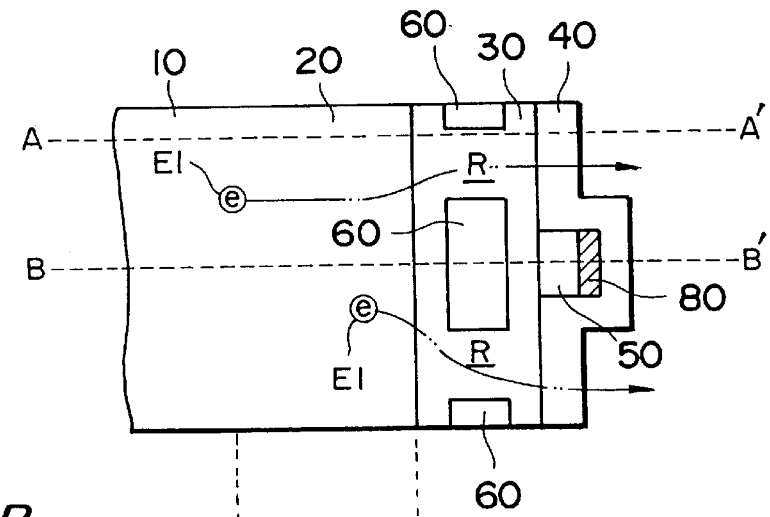
FIG. 4A is an enlarged cross-sectional view of the semiconductor photocathode CT including lines A–A' and B–B' of FIG. 1.
Figure 4B:
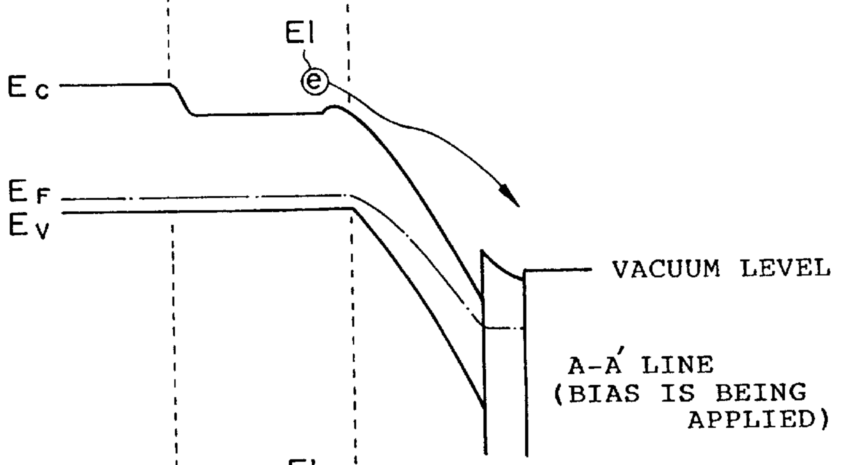
FIGS. 4B and 4C are energy band charts respectively taken along lines A–A' and B–B' of FIG. 4A in the case where a bias is applied to the semiconductor photocathode CT.

FIG. 4A is an enlarged cross-sectional view of a portion of the photocathode CT including lines A–A' and B–B' of FIG. 1. FIGS. 4B and 4C are energy band charts respectively taken along lines A–A' and B–B' of FIG. 4A in the case where the bias is applied to the photocathode CT. Here, FIG. 5 is a view three-dimensionally showing the potential with respect to electrons within a plane including lines A–A' and B–B' for explaining, in a manner easier to understand, behaviors of the electrons shown in FIGS. 4A to 4C.

Figure 4C:
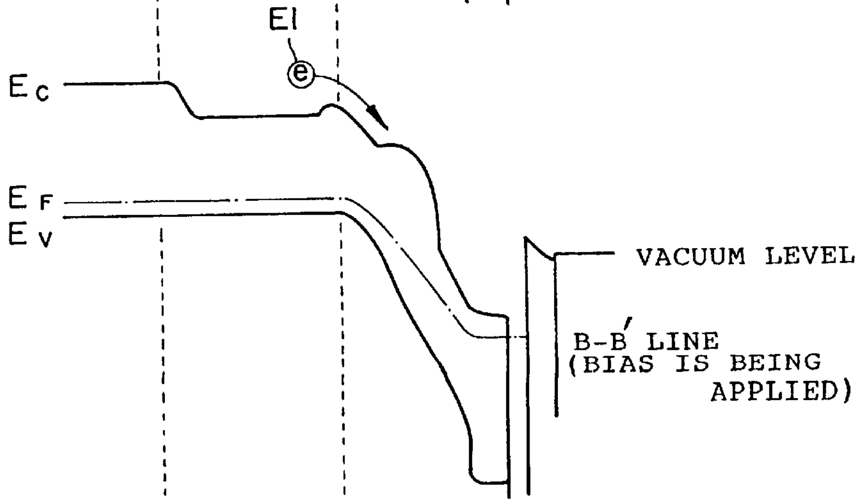
Figure 5:
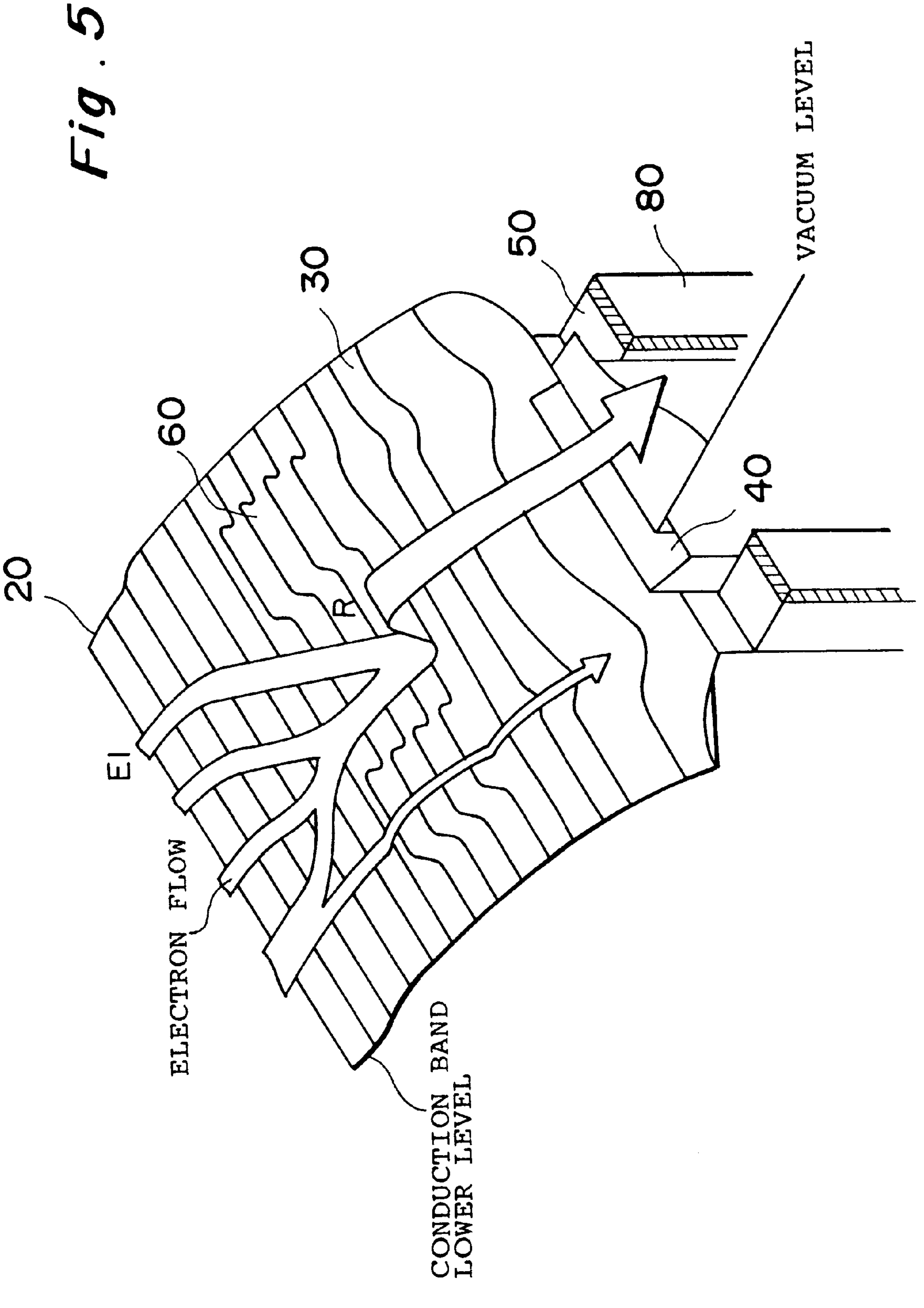
FIG. 5 is a view three-dimensionally showing the potential with respect to electrons within a plane including lines A–A' and B–B' for explaining, in a manner easier to understand, behaviors of the electrons shown in FIGS. 4A to 4C.

As can be seen from FIG. 4C, the semiconductor section 60 functions as a potential barrier restraining excited electrons E1 from advancing toward the contact layer 50 also in the case where the bias is applied to the photocathode CT, since the semiconductor section 60 has a wider energy band gap than the second semiconductor layer 30. Due to such a potential barrier, the electrons E1 running through the second semiconductor layer 30 change their orbits so as to bypass the semiconductor section 60 and advance toward the third semiconductor layer 40.

When the bias is applied to the surface electrode 80, the advancing direction of the electrons E1 is bent toward the third semiconductor layer 40 formed in an area on the second semiconductor layer 30 where the contact layer 50 is not formed. Namely, the electron E1 passes through a region R between the neighboring semiconductor sections 60, whereby the density of electron flows passing through the cross section of line A–A' increases (see FIG. 5). When passing through the region R between the semiconductor sections 60, the electron E1 advancing through the second semiconductor layer 30 while being excited to the lowest energy level of the gamma valley of the conduction band $E_C$ is accelerated by the electric field generated within the second semiconductor layer 30 and receives an energy, thereby being excited to a higher energy level (second energy level) in an upper satellite valley (L or X valley) higher than the lowest energy level of the gamma valley in the conduction band or in the gamma valley. During a period of time after the electron passes through the region R between the semiconductor sections 60 till it enters the third semiconductor layer 40, a force acts on the electron in a divergent direction. When the distance by which the electron travels in this period is set to 0.5 to 2.0 $\mu$m, for example, and the width of the semiconductor section 60 is set so as to be the same as or greater than the width of the contact layer 50, in practice, substantially all the electrons E1 generated in the semiconductor substrate 10, first semiconductor layer 20, and second semiconductor layer 30 enter the third semiconductor layer 40 without being absorbed by the contact layer 50. Since the work function of the third semiconductor layer 40 is lower than that of the second semiconductor layer 30, the electrons E1 are efficiently emitted into the vacuum as shown in FIGS. 4B and 5.

Figure 6:
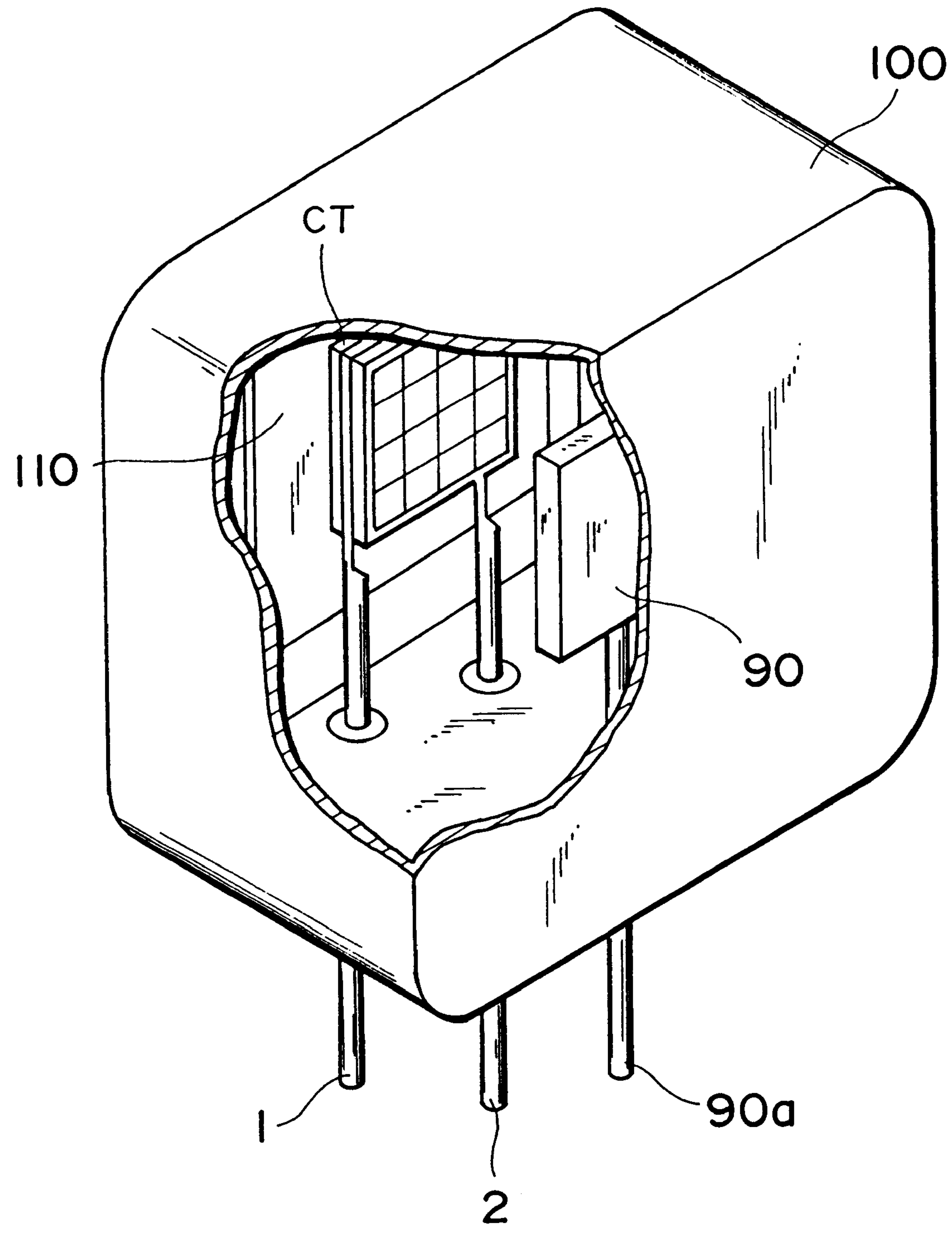
FIG. 6 is a perspective view showing, in a partially broken state, a semiconductor photocathode apparatus in which the semiconductor photocathode CT shown in FIG. 1 is accommodated in a sealed container.

FIG. 6 is a perspective view showing, in a partially broken state, a semiconductor photocathode apparatus in which the photocathode CT shown in FIG. 1 is accommodated in a sealed container 100. This semiconductor photocathode apparatus comprises the semiconductor photocathode and the anode disposed within the sealed container 100 whose inside is maintained at a pressure (not higher than $10^{-5}$ torr or preferably not higher than $10^{-10}$ torr) lower than the atmospheric pressure. The photocathode CT has a first connecting pin 1 and a second connecting pin 2 electrically connected thereto, whereas the anode 90 has a third connecting pin 90*a* electrically connected thereto. The first connecting pin 1, second connecting pin 2, and third connecting pin 90*a* penetrate through the sealed container 100. Here, an entrance window 110 for receiving light or electromagnetic wave is disposed on the side of the photocathode CT opposite to the anode 90. Here, the entrance window 110 may be bonded to the container 100.

The semiconductor photocathode apparatus formed as the photocathode CT and the anode 90 are disposed within the sealed container 100 is used in a state where a voltage is applied between the first and second connecting pins 1 and 2 and between the second and third connecting pins 2 and 90*a* such that the potential of the first connecting pin 1 is higher than that of the second connecting pin 2 and that of the third connecting pin 90*a* is higher than that of the first connecting pin 1. Here, as can be seen from the photocathode CT shown in FIG. 1, the surface electrode 80 and the ohmic electrode 70 are connected to the first and second connecting pins 1 and 2 by way of metals made of gold or the like, respectively; whereas the anode 90 is provided with the third connecting pin 90*a* connected thereto.

In the following, a method of making the photocathode CT shown in FIG. 1 will be explained.

FIGS. 7A to 7G are step-by-step cross-sectional views for explaining a method of making the semiconductor photocathode CT shown in FIG. 1 in terms of the cross-sectional configuration of the semiconductor photocathode CT.

First, the semiconductor substrate 10 is prepared. Then, the first semiconductor layer 20, a second semiconductor 30*a*, a semiconductor layer 60*a*, and a resist layer 200*a* are successively formed on the semiconductor substrate 10 (see FIG. 7A). In order to form each semiconductor layer, epitaxial growth techniques such as MBE (molecular beam epitaxial growth) technique and MOCVD (metal organic chemical vapor deposition) technique can be used.

Figure 7A:
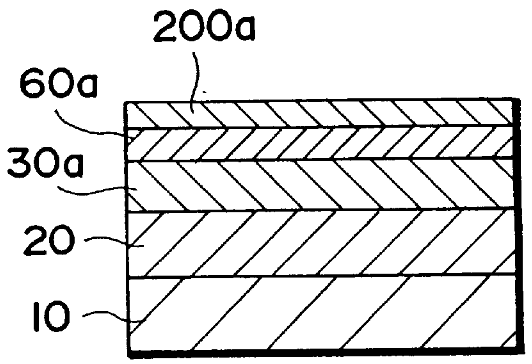
FIGS. 7A to 7G are step-by-step cross-sectional views for explaining a method of making the semiconductor photocathode CT shown in FIG. 1 in terms of the cross-sectional configuration of the semiconductor photocathode CT.
Figure 7B:
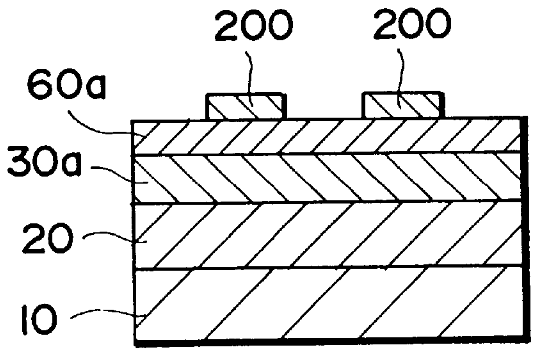

Thereafter, the resist layer 200*a* is etched from its surface to the semiconductor layer 60*a* so as to form a mesh-shaped resist 200 (see FIG. 7B). Then, while the resist 200 is used as a mask, the semiconductor layer 60*a* is etched.

Figure 7C:
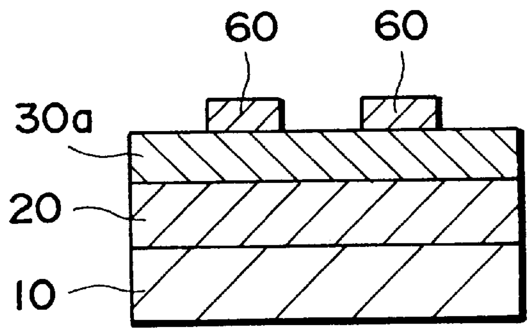
Figure 7D:
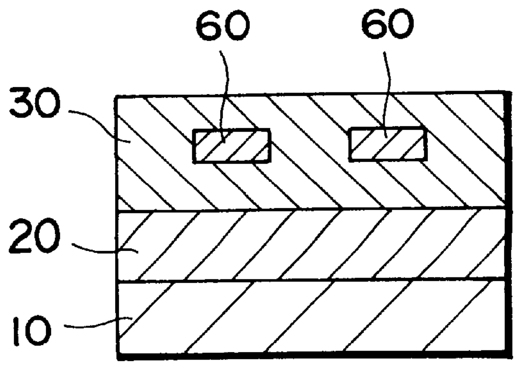
Figure 7E:
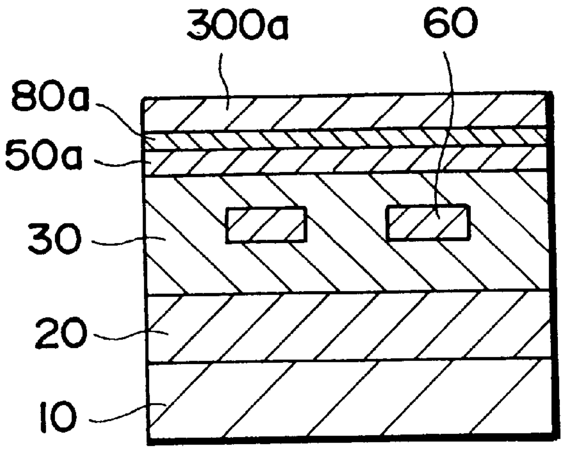
Figure 7F:
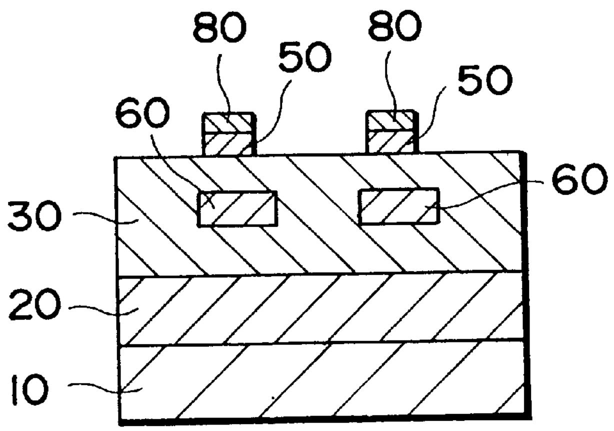
Figure 7G:
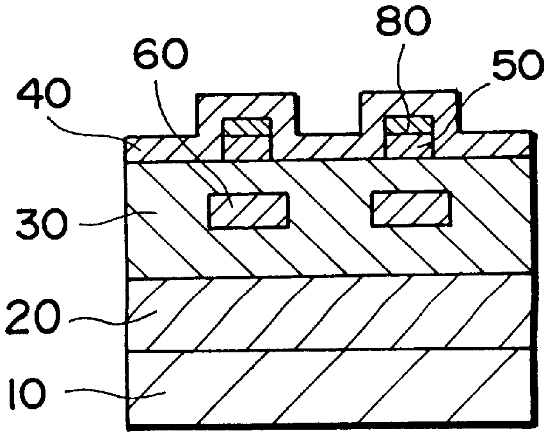

Subsequently, the resist 200 is eliminated, thereby forming the mesh-shaped semiconductor section 60 (see FIG. 7C). Thereafter, the material constituting the second semiconductor 30*a* is deposited on the second semiconductor 30*a* and semiconductor section 60 so as to cover their surfaces, thereby forming the second semiconductor layer 30 (see FIG. 7D). Further, a contact layer 50*a*, a surface electrode layer 80*a*, and a resist layer 300*a* are formed on the second semiconductor layer 30 so as to attain a configuration such as that shown in FIG. 1 (see FIG. 7E). The resist layer 300*a* is etched from its surface to the surface electrode layer 80*a* so as to form a mesh-shaped resist corresponding to the position of the semiconductor layer 60. While thus etched resist is used as a mask, the surface electrode layer 80*a* and the contact layer 50*a* are etched so as to form the mesh-shaped contact layer 50 and surface electrode 80 (see FIG. 7F). After thus formed assembly is heated in an environment with a pressure lower than the atmospheric pressure so as to clean the second semiconductor layer 30, the third semiconductor layer 40 is deposited so as to cover the contact layer 50, surface electrode 80, and second semiconductor layer 30, thereby yielding the photocathode shown in FIG. 1 (see FIG. 7G).

Here, in this embodiment, InP, InGaAs, and InP are respectively used for the semiconductor substrate 10, first semiconductor layer 20, and second semiconductor layer 30, whereas resist films each having a thickness of 200 nm are employed.

The dopant concentration (carrier concentration) of the first semiconductor layer 20 is $p^+$ ($1\times10^{18}$ to $1\times10^{19}/cm^3$). The suitable thickness of the first semiconductor layer 20 is 1.5 to 2.5 $\mu$m. The dopant concentration (carrier concentration) of the second semiconductor layer 30 is $p^-$ ($1\times10^{17}/cm^3$ or less). The suitable thickness of the second semiconductor layer 30 is 1.0 to 10 $\mu$m. The dopant concentration (carrier concentration) of the semiconductor section 60 is $p^{--}$ ($1\times10^{17}$ to $1\times10^{14}/cm^3$). The suitable thickness of the semiconductor section 60 is 0.5 to 2.0 $\mu$m. The contact layer 50 has $n^+$ ($1\times10^{18}$ to $1\times10^{19}/cm^3$). Preferably, the contact layer 50 has a thickness of 1 to several $\mu$m. The surface electrode 80 can be deposited on the contact layer 50 by a vacuum deposition technique using a metal such as Al. Also, in this method, the third semiconductor layer 40 is made of $Cs_2O$, which is formed when Cs (cesium) and O (oxygen) are alternately deposited or when respective material gases including their materials are alternately supplied.

Figure 8:
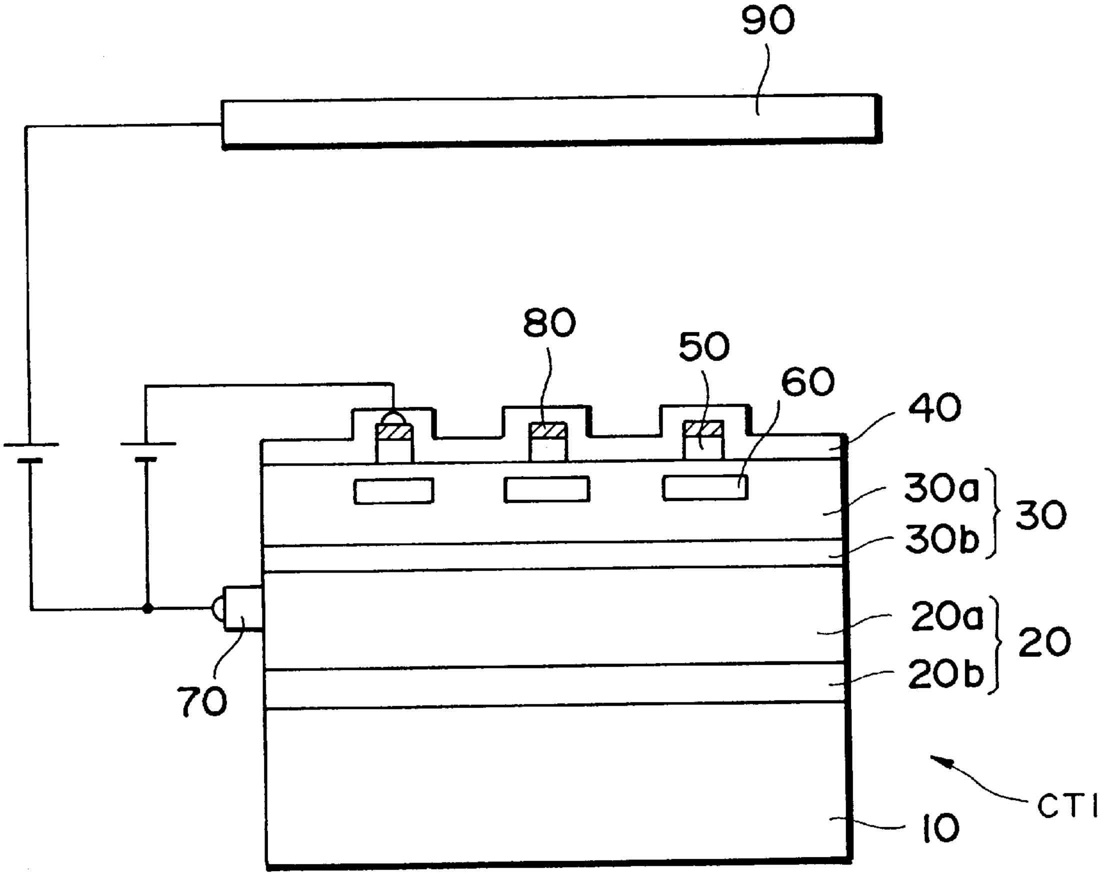
FIG. 8 is a cross-sectional view showing another configuration of the semiconductor photocathode in accordance with the first embodiment in its cross section taken along the thickness direction.

Here, as shown in FIG. 8, the p-type first semiconductor layer 20 of the photocathode CT instead of the photocathode CT shown in FIG. 1 may have, near the interface between the p-type first semiconductor layer 20 and the semiconductor substrate 10, a second graded layer 20*b* having an energy band gap whose width is between the width of energy band gap of a first region 20*a* in the first semiconductor layer 20 on the side of the p-type second semiconductor layer 30 and the width of energy band gap of the semiconductor substrate 10. In this case, in the semiconductor photocathode CT1, the crystal lattice alignment at the interface between the semiconductor substrate 10 and the p-type first semiconductor layer 20 can be kept favorably so as to reduce the leak current and recombination current, while the photoelectron recoils from the potential barrier so as to be efficiently introduced into the second semiconductor layer 30.

Also, the p-type second semiconductor layer 30 may have, near the interface between the p-type second semiconductor layer 30 and the p-type first semiconductor layer 20, a first graded layer 30*b* having an energy band gap whose width is between the width of energy band gap of a second region 30*a* in the p-type second semiconductor layer 30 on the side of the third semiconductor layer 40 and the width of the energy band gap of the first semiconductor layer 20. In this case, the crystal lattice alignment at the interface between the p-type second semiconductor layer 30 and the p-type first semiconductor layer 20 can be kept favorably so as to reduce the leak current and recombination current. Namely, the second graded layer 20*b* has a lattice constant between the lattice constant of the first region 20*a* and the lattice constant of the semiconductor substrate 10, whereas the first graded layer 30*b* has a lattice constant between the lattice constant of the second region 30*a* and the lattice constant of the first region 20*a*.

Figure 9:
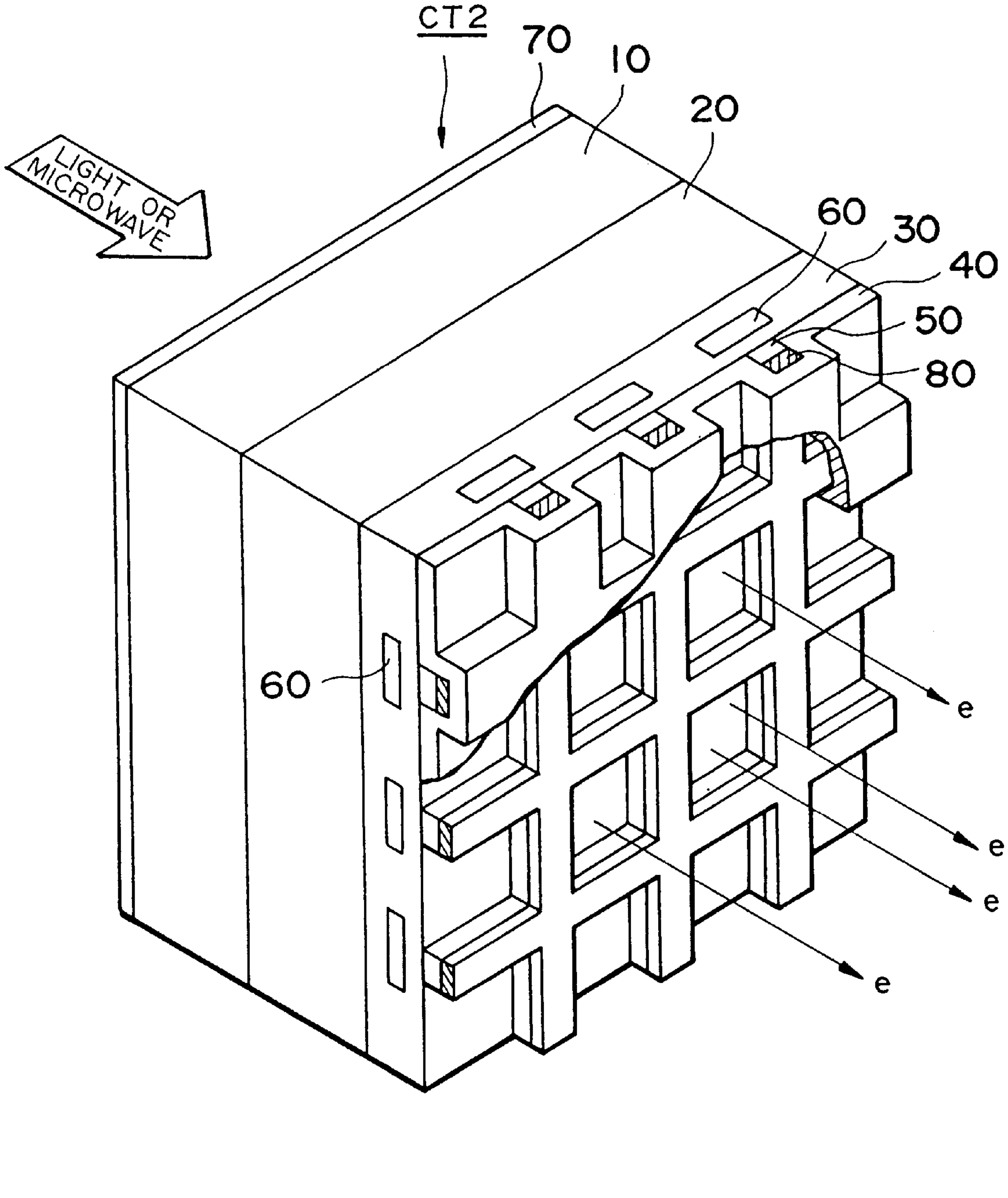
FIG. 9 is a perspective view showing another configuration of the semiconductor photocathode in accordance with the first embodiment.

Though the ohmic electrode 70 is attached to the first semiconductor layer 20 in the semiconductor photocathode CT shown in FIG. 1, it may also be disposed on the rear face of the semiconductor substrate 10 as in the case of a photocathode CT2 shown in FIG. 9. When the semiconductor substrate 10 is to be provided with the ohmic electrode 70, the installation of the ohmic electrode 70 can be easier than that in the photocathode CT shown in FIG. 1. Here, in the photocathode CT2 shown in FIG. 9, both the second graded layer 20*b* and the first graded layer 30*b* may provided as in the case of the photocathode CT1 shown in FIG. 8.

The foregoing photocathodes (CT, CT1, and CT2) explained with reference to FIGS. 1, 8, and 9 can be disposed within the sealed container 100 shown in FIG. 6.

(Second Embodiment)

In the following, a second embodiment of the semiconductor photocathode will be explained with reference to FIGS. 10 and 11. Here, the materials constituting the respective semiconductor layers and dopant concentrations therein are the same as those in the semiconductor photocathode CT explained with reference to FIGS. 1 and 2.

Figure 10:
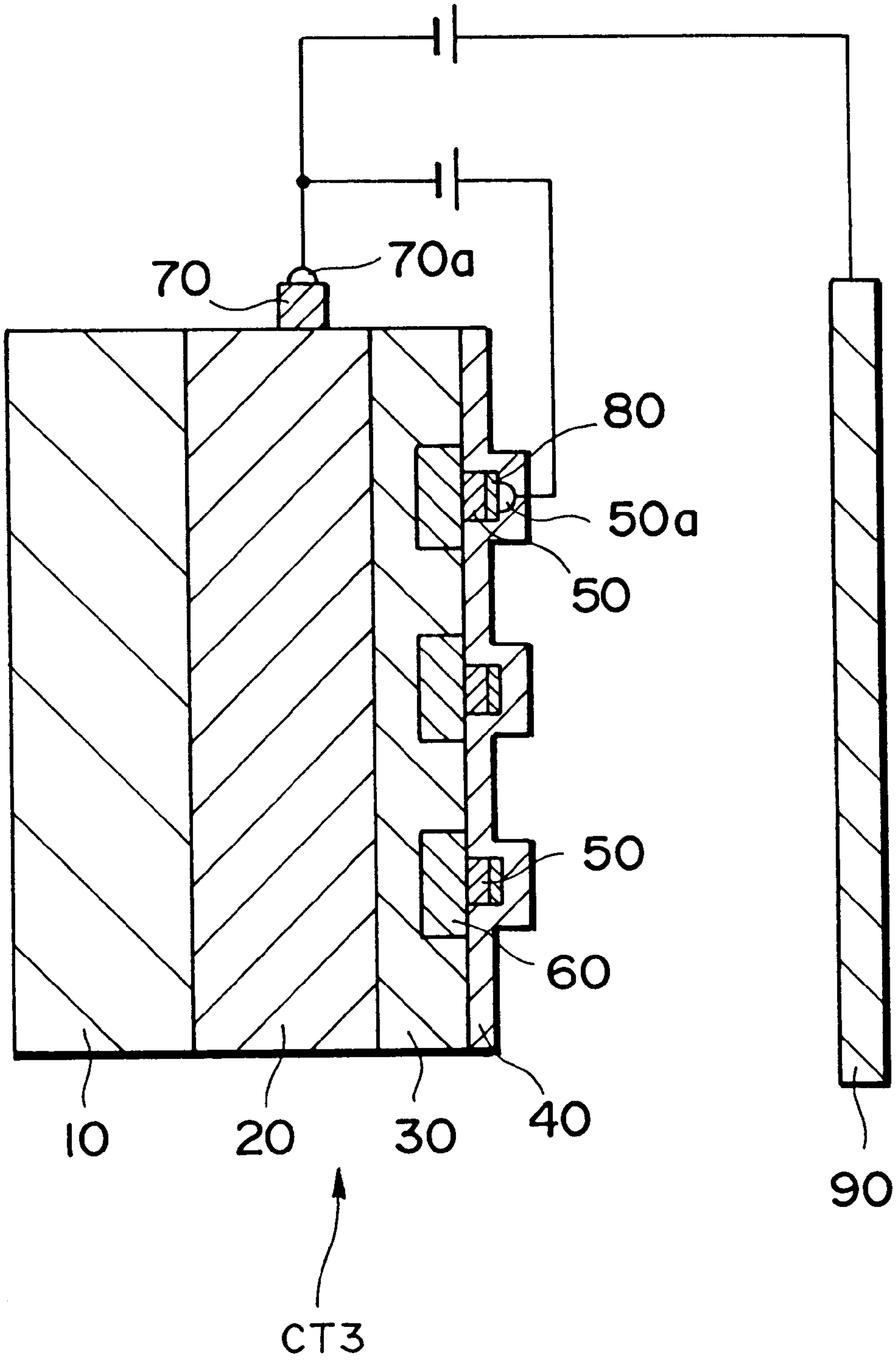
FIG. 10 is a cross-sectional view of a semiconductor photocathode CT3 in accordance with a second embodiment taken along its thickness direction.
Figure 11A:
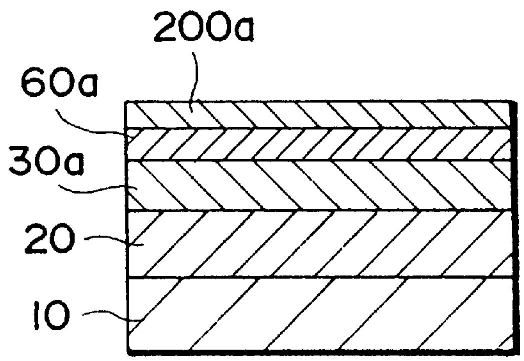
FIGS. 11A to 11H are step-by-step cross-sectional views for explaining a method of making the semiconductor photocathode CT3 shown in FIG. 10 in terms of the cross-sectional configuration of the semiconductor photocathode CT3.
Figure 11B:
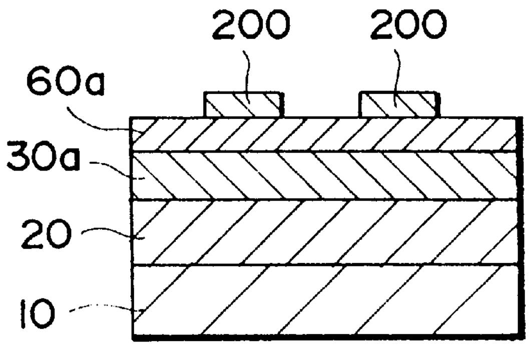
Figure 11C:
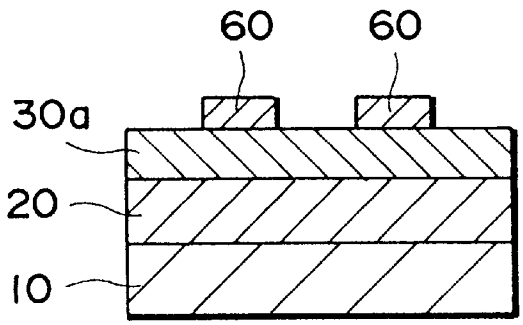
Figure 11D:
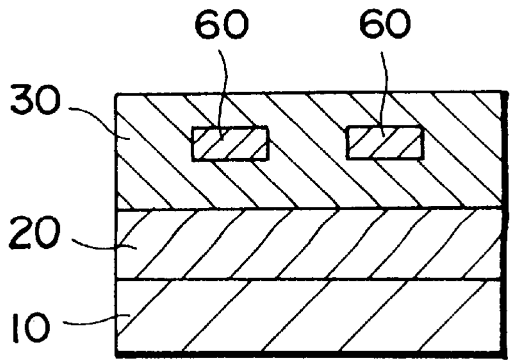
Figure 11E:
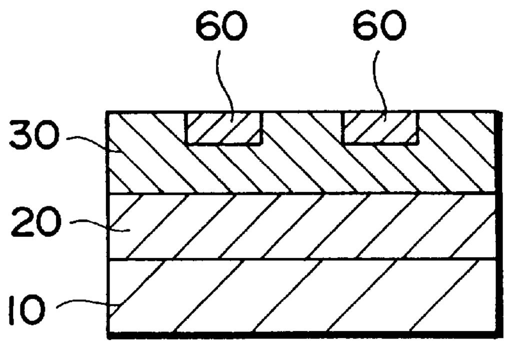
Figure 11F:
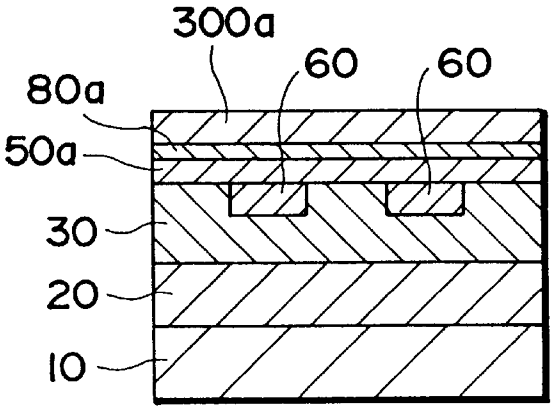
Figure 11G:
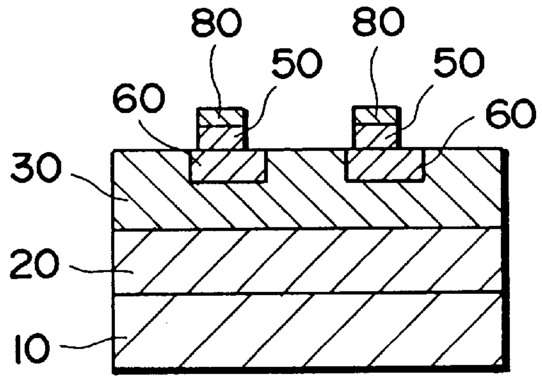
Figure 11H:
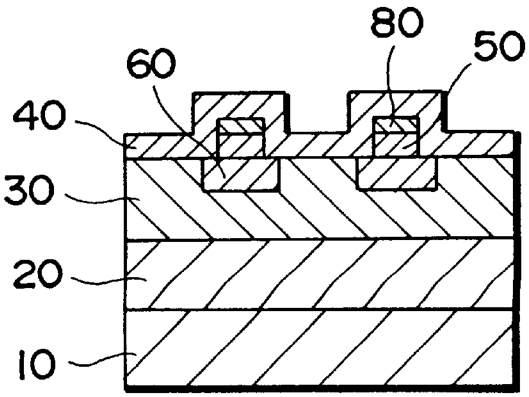

A semiconductor photocathode CT3 shown in FIG. 10 differs from the photocathode CT shown in FIG. 1 in terms of the position of the semiconductor section 60 within the second semiconductor layer 30. Namely, the semiconductor photocathode CT3 is formed as the p-type first semiconductor layer 20, the p-type second semiconductor layer 30, and the third semiconductor layer 40 are successively disposed on the semiconductor substrate 10, whereas the grid-shaped semiconductor section 60 is embedded in the p-type second semiconductor layer 30. The contact layer 50 is disposed on the surface of thus embedded semiconductor section 60 where the third semiconductor layer 40 is not formed, whereas the surface electrode 80 is disposed on and in ohmic contact with the contact layer 50. Also, the first semiconductor layer 20 is provided with the ohmic electrode 70. These electrodes 80 and 70 are connected to separated connecting pins, which are not depicted, by way of the metals 50*a* and 70*a* such as gold, respectively. The anode 90 is disposed so as to oppose to the third semiconductor layer 40 and is connected to another non-depicted connecting pin. As in the case of the semiconductor photocathode CT shown in FIG. 1, thus configured semiconductor photocathode CT3 and the anode 90 are disposed within the sealed container 100 such as that shown in FIG. 6.

FIGS. 11A to 11H are step-by-step cross-sectional views for explaining a method of making the semiconductor photocathode CT3 shown in FIG. 10 in terms of the cross-sectional configuration thereof. First, the semiconductor substrate 10 is prepared. Then, the first semiconductor layer 20, the second semiconductor 30*a*, the semiconductor layer 60*a*, and the resist layer 200*a* are successively formed on the semiconductor substrate 10 (see FIG. 11A). In order to form each semiconductor layer, MBE (molecular beam epitaxial growth) technique can be used. Thereafter, the resist layer 200*a* is etched from its surface to the semiconductor layer 60*a* so as to form the mesh-shaped resist 200 (see FIG. 11B). Then, while the resist 200 is used as a mask, the semiconductor layer 60*a* is etched so as to form the mesh-shaped semiconductor section 60 (see FIG. 11C). Thereafter, the material constituting the second semiconductor 30*a* is deposited on the second semiconductor 30*a* and semiconductor section 60 so as to cover their surfaces, thereby forming the second semiconductor layer 30 (see FIG. 11D). Subsequently, the second semiconductor layer 30 is ground till the semiconductor section 60 is exposed from its surface (see FIG. 11E). Further, the contact layer 50*a*, the surface electrode layer 80*a*, and the resist layer 300*a* are successively formed on the second semiconductor layer 30 and semiconductor layer 60 (see FIG. 11F). Then, the resist layer 300*a* is etched from its surface to the surface electrode 80*a* so as to form a resist pattern corresponding to the semiconductor layer 60. While thus formed resist pattern is used as a mask, the surface electrode layer 80*a* and the contact layer 50*a* are successively etched so as to form the mesh-shaped contact layer 50 and surface electrode 80 (see FIG. 11G). After thus formed assembly is heated in an environment with a pressure lower than the atmospheric pressure so as to clean the second semiconductor layer 30, the third semiconductor layer 40 is deposited so as to cover the contact layer 50, surface electrode 80, and second semiconductor layer 30, thereby forming the photocathode CT3 shown in FIG. 10 (see FIG. 11H).

(Third Embodiment)

In the following, a third embodiment of the semiconductor photocathode will be explained with reference to FIG. 12. Here, the materials constituting the respective semiconductor layers and dopant concentrations therein are the same as those in the semiconductor photocathode CT explained with reference to FIG. 1.

Figure 12:
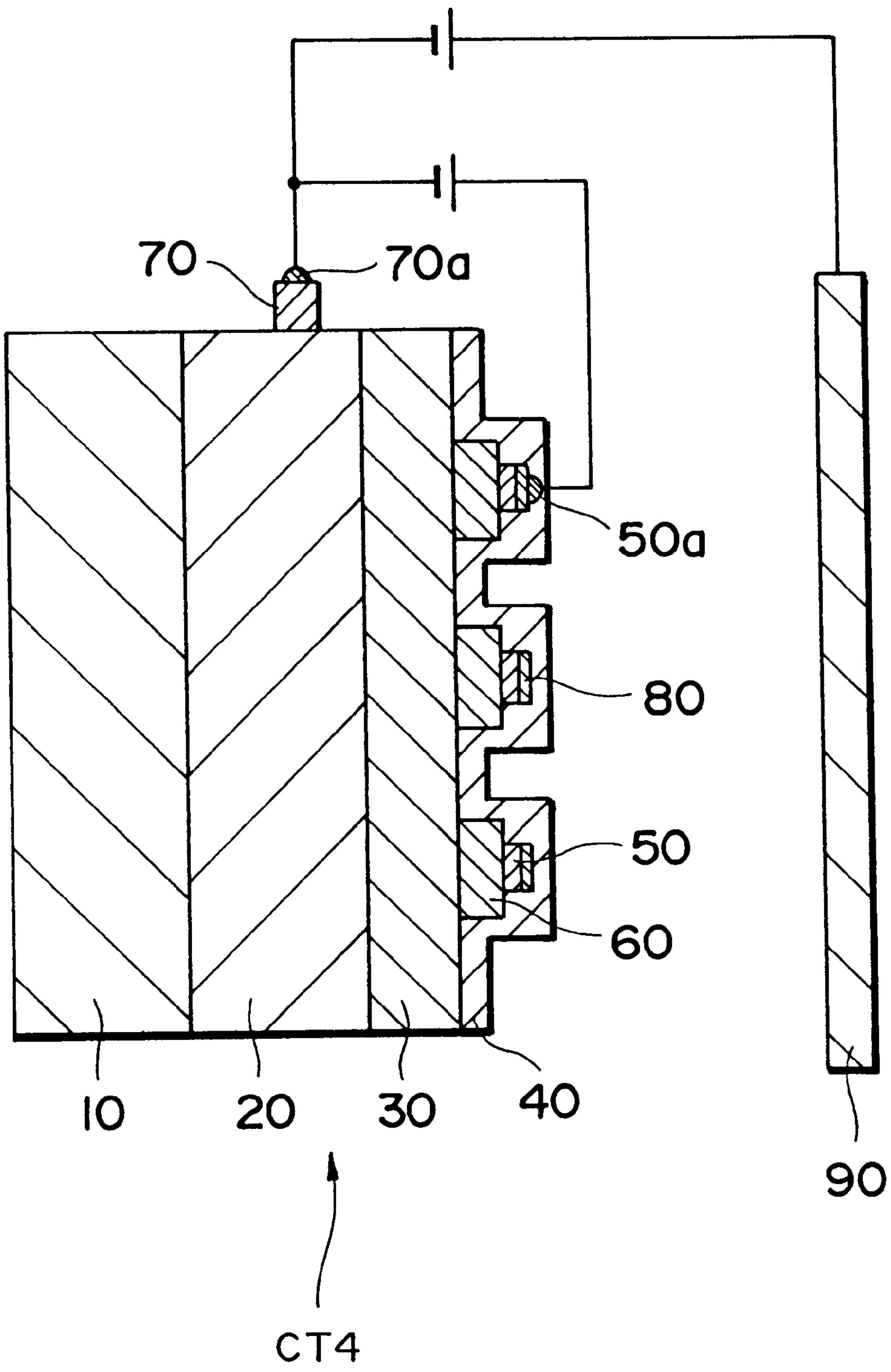
FIG. 12 is a cross-sectional view of a semiconductor photocathode CT4 in accordance with a third embodiment taken along its thickness direction.

FIG. 12 is a cross-sectional view of a semiconductor photocathode CT4 in accordance with this embodiment taken along its thickness direction. The semiconductor photocathode CT4 is configured such that the semiconductor section 60 disposed within the second semiconductor layer 30 in the semiconductor photocathode CT shown in FIG. 1 is in contact with the second semiconductor layer 30 by only one surface. Namely, the semiconductor photocathode CT4 is formed as the p-type first semiconductor layer 20, the p-type second semiconductor layer 30, the third semiconductor layer 40, the grid-shaped semiconductor section 60, the contact layer 50, and the surface electrode 80 are successively disposed on the semiconductor substrate 10. The third semiconductor layer 40 is formed so as to cover the surface of the second semiconductor layer 30, the semiconductor section 60, the contact layer 50, and the surface electrode 80. Also, the first semiconductor layer 20 is provided with the ohmic electrode 70. These electrodes 80 and 70 are connected to separated connecting pins, which are not depicted, by way of the metals 50*a* and 70*a* such as gold, respectively. The anode 90 is disposed so as to oppose to the third semiconductor layer 40 and is connected to another non-depicted connecting pin. As in the case of the semiconductor photocathode CT shown in FIG. 1, thus configured semiconductor photocathode CT4 and the anode 90 are disposed within the sealed container 100 such as that shown in FIG. 6.

In the semiconductor photocathode of this embodiment, due to its configuration, the semiconductor section 60 can be formed without etching of the second semiconductor layer 30. Accordingly, not only it can be manufactured more easily than the semiconductor photocathode shown in FIGS. 1 to 11, but also the crystal lattice alignment of the second semiconductor layer can be prevented from deteriorating upon etching.

(Fourth Embodiment)

Figure 13A:
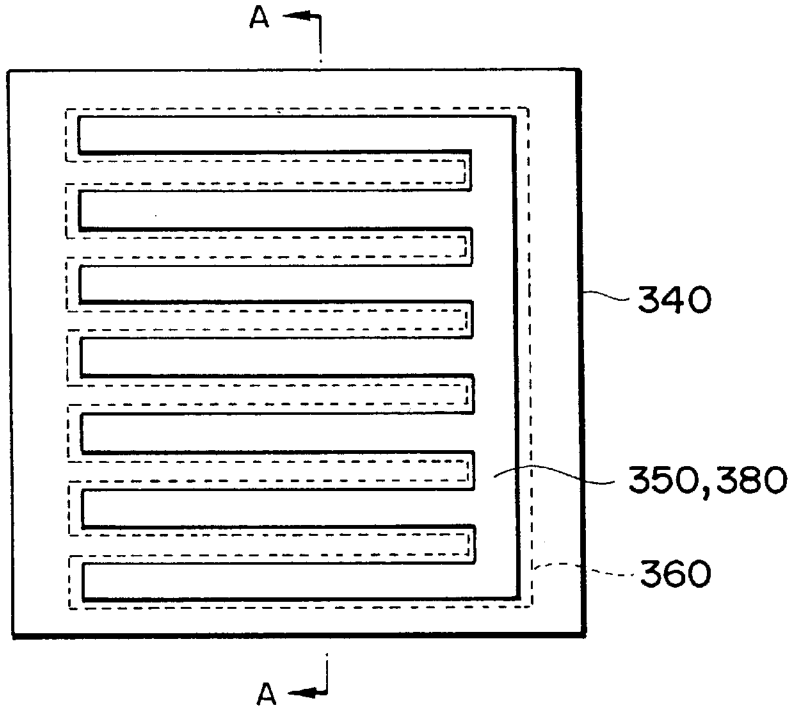
FIGS. 13A to 13C are respectively a plan view of a semiconductor photocathode in accordance with a fourth embodiment, a cross-sectional view thereof taken along line A–A' in FIG. 13A, and a cross-sectional view thereof taken along line B–B' in FIG. 13B.
Figure 13B:
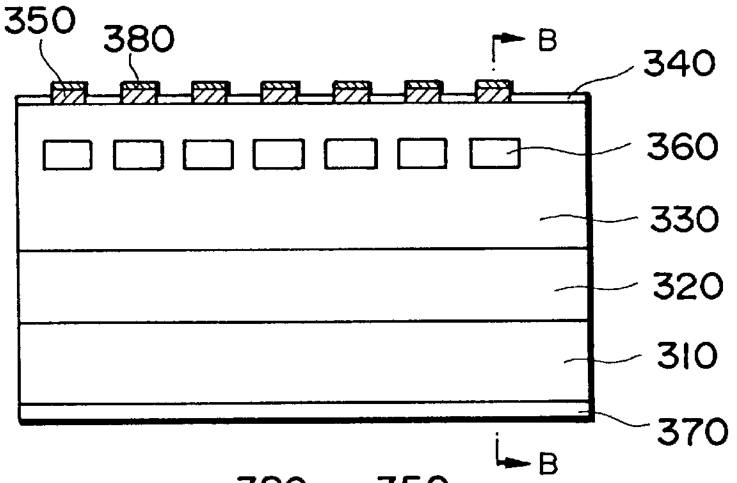
Figure 13C:
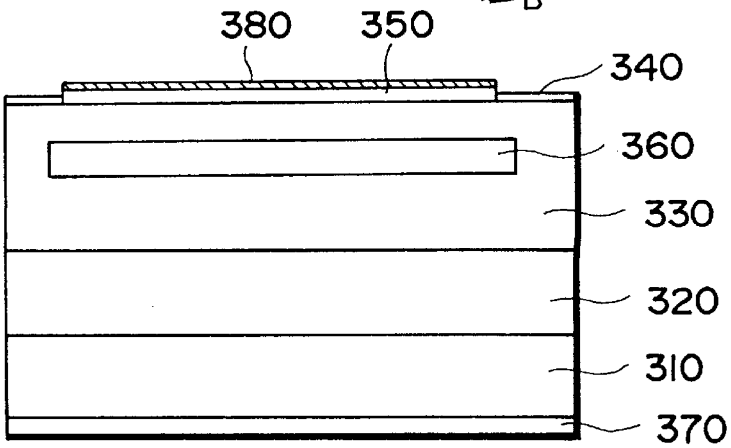

In the following, a fourth embodiment of the semiconductor photocathode will be explained. FIGS. 13A to 13C are respectively a plan view of the semiconductor photocathode in accordance with this embodiment, a cross-sectional view thereof taken along line A–A' in FIG. 13A, and a cross-sectional view thereof taken along line B–B' in FIG. 13B.

This semiconductor photocathode comprises a semiconductor substrate 310, a first semiconductor layer 320 formed on the semiconductor substrate 310, a second semiconductor layer 330 formed on the first semiconductor layer 320, a third semiconductor layer (activation layer) 340 formed on the second semiconductor layer 330, a semiconductor section 360 embedded in the second semiconductor layer 330, a contact layer 350 formed on the second semiconductor layer 330, and a surface electrode 380 disposed on and in ohmic contact with the contact layer 350.

In detail, formed on the semiconductor substrate 310 is the first semiconductor layer 320 (light absorbing layer) of p-type, which generates an electron in response to light or electromagnetic wave incident. The first semiconductor layer 320 has a first dopant concentration. Formed on the first semiconductor layer 320 is the second semiconductor layer 330 (electron transfer layer) of p-type having a second dopant concentration lower than the first dopant concentration. The comb-shaped contact layer 350 and surface electrode 380 are formed so as to cover the surface of the second semiconductor layer 330. Namely, the contact layer 350 includes stripe-like semiconductor portions. The contact layer 350 forms a pn junction with the second semiconductor layer 330. The third semiconductor layer 340 (activation layer) is disposed on the surface of the second semiconductor layer 330 where the contact layer 350 is not formed. The third semiconductor layer 340 has a lower work function than the second semiconductor layer 330. Embedded in the second semiconductor layer 330 is the semiconductor section 360 (channel grid) having a third dopant concentration which is about the same as or lower than the second dopant concentration. The semiconductor section 360 is disposed directly below the contact layer 350 and surface electrode 380.

Since the semiconductor section 360 in this embodiment has a stripe form, the electron generated in the semiconductor photocathode in response to light incident runs from the first semiconductor layer 320 toward the activation layer 340 due to the electric field in the semiconductor photocathode. Since the comb-shaped semiconductor section 360 is embedded in the second semiconductor layer 330, the electron is efficiently directed toward a gap between the stripes 350. Since the activation layer 340 is disposed in the gaps between the stripes 350, the electron is emitted from the surface of the third semiconductor layer 340 with a high homogeneity. Here, the semiconductor substrate 310 is provided with an ohmic electrode 370 for applying a bias thereto.

(Fifth Embodiment)

Figure 14:
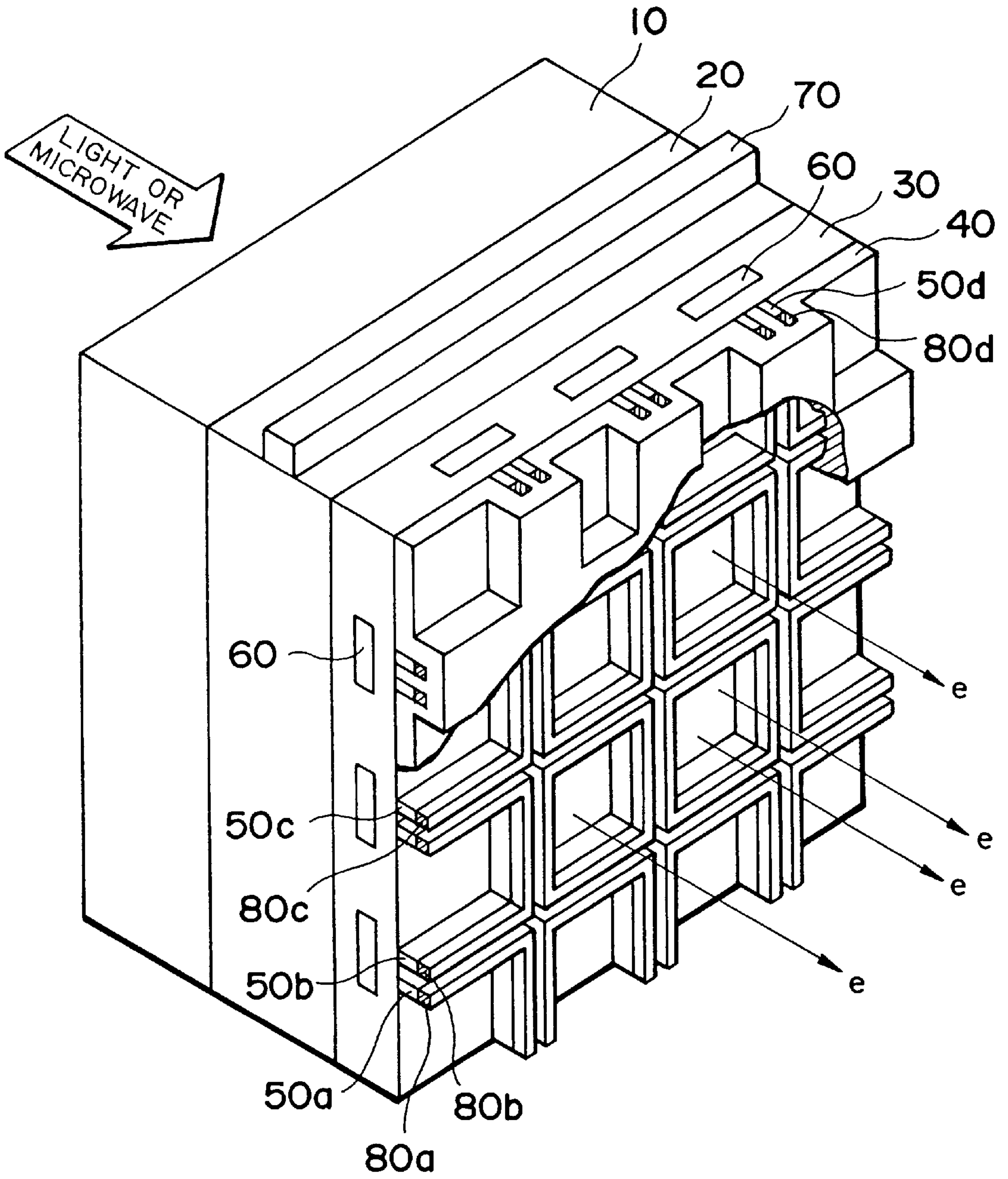
FIG. 14 is a perspective view showing, in a partially broken state, a semiconductor photocathode apparatus in accordance with a fifth embodiment.

In the following, a fifth embodiment of the present invention will be explained. FIG. 14 is a perspective view showing, in a partially broken state, the semiconductor photocathode apparatus in accordance with this embodiment. In FIG. 14, in order to clarify the configuration of this semiconductor photocathode, the layer structure of the contact layer 50 and surface electrode 80 are depicted only at the cross-sectional portion of the semiconductor photocathode. In this semiconductor photocathode, the contact layer 50 shown in FIG. 1 is divided into contact layers 50*a*, 50*b*, . . . , whereas the surface electrode 80 shown in FIG. 1 is divided into surface electrodes 80*a*, 80*b*, . . . . Since the contact layer 50*a* and surface electrode 80*a* are electrically insulated from the contact layer 50*b* and surface electrode 80*b*, a potential can be applied to the surface electrode 80*a* independently of the potential of the surface electrode 80*b*. Here, the materials constituting the other elements (10, 20, 30, 40, 60, and 70) and dopant concentrations therein are the same as those shown in FIG. 1.

(Sixth Embodiment)

Figure 15:
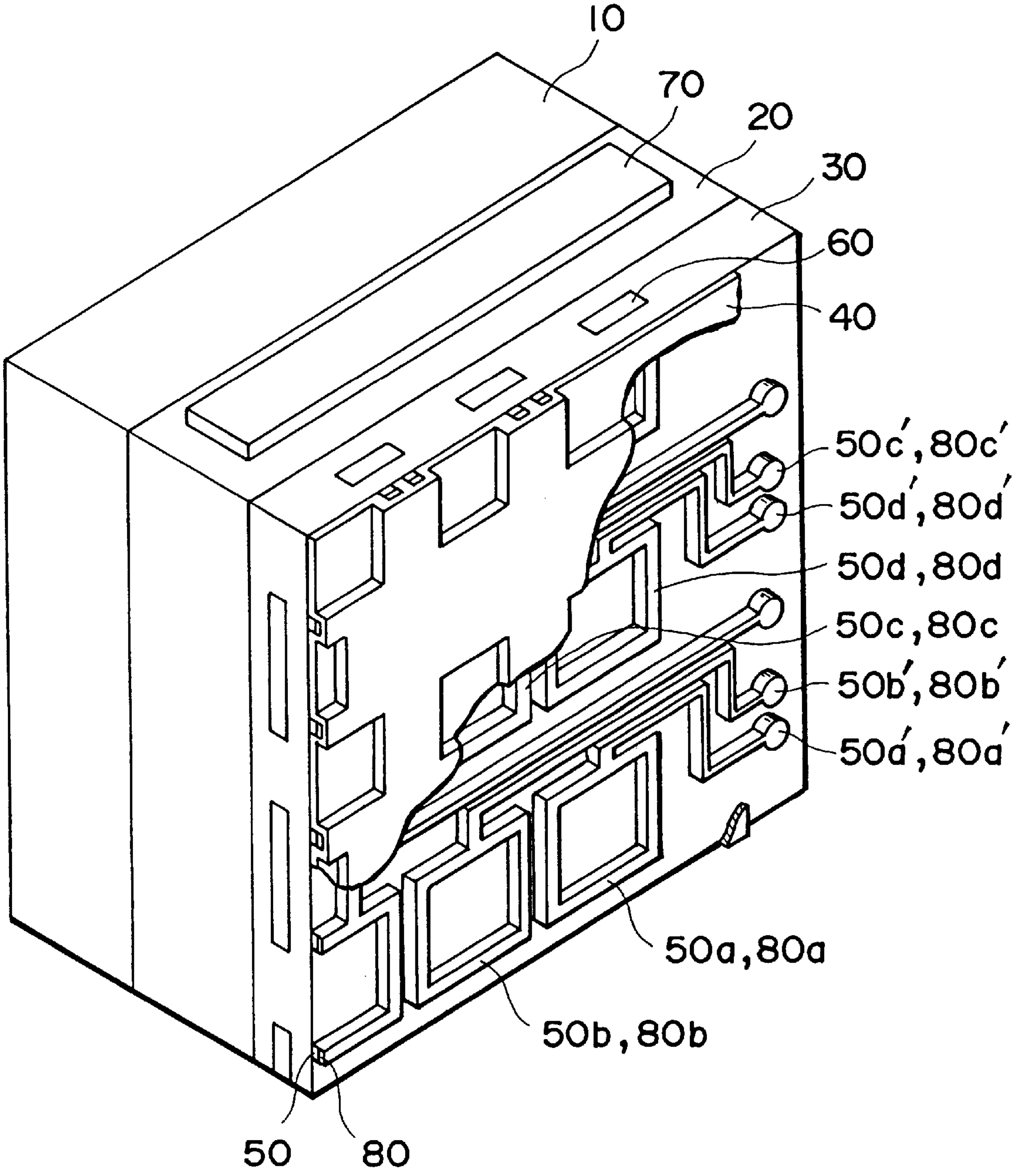
FIG. 15 is a perspective view showing, in a partially broken state, a semiconductor photocathode apparatus in accordance with a sixth embodiment.
Figure 16A:
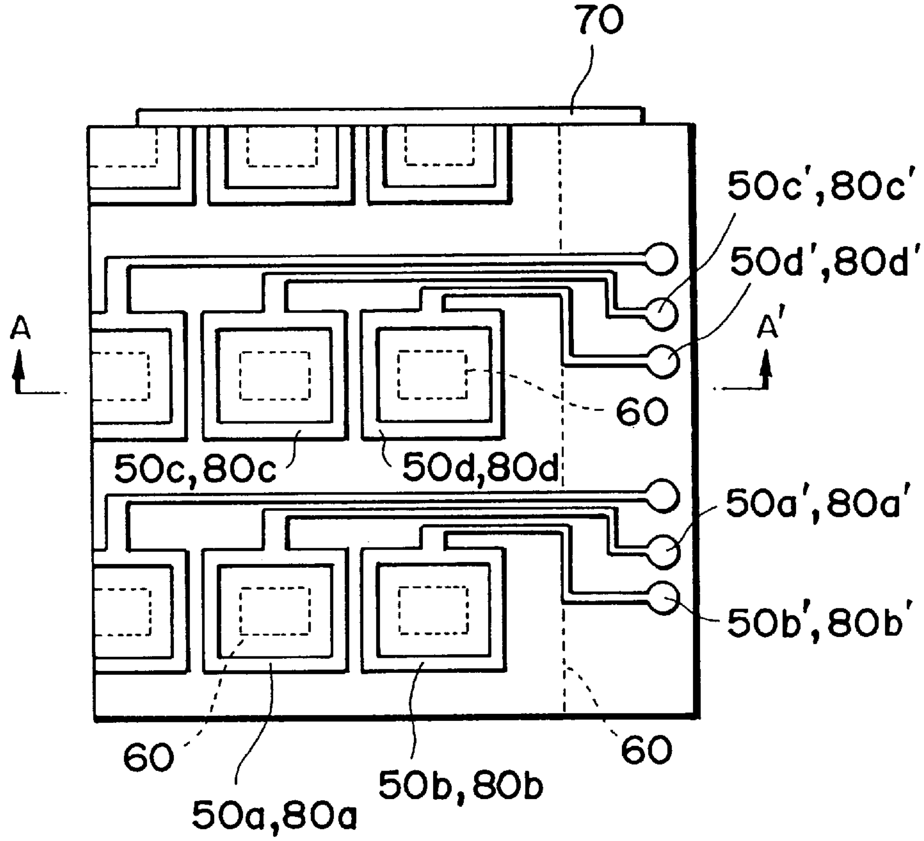
FIGS. 16A and 16B are respectively a plan view of the semiconductor photocathode shown in FIG. 15 and a cross-sectional view thereof taken along line A–A' in FIG. 16A.
Figure 16B:
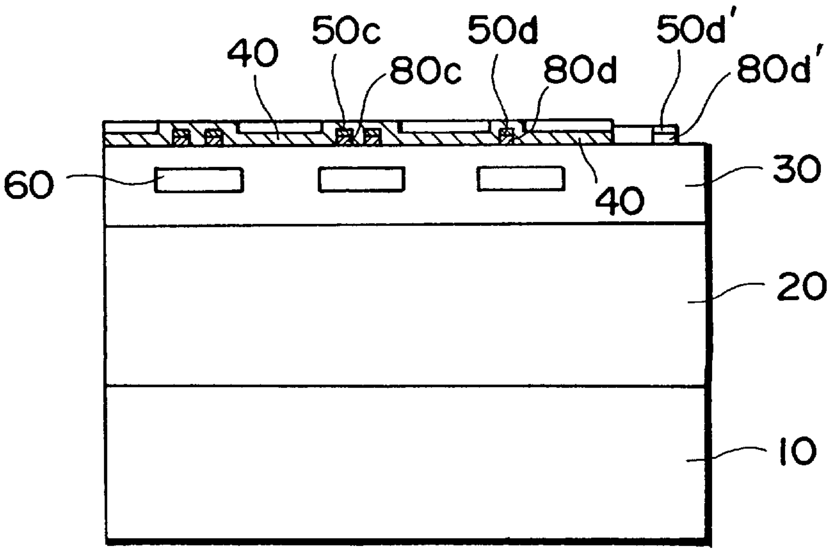

In the following, a sixth embodiment of the present invention will be explained. FIG. 15 is a perspective view showing, in a partially broken state, the semiconductor photocathode apparatus in accordance with this embodiment. In FIG. 15, in order to clarify the configuration of this semiconductor photocathode, the layer structure of the contact layer 50 and surface electrode 80 are depicted only at the cross-sectional portion of the semiconductor photocathode. FIGS. 16A and 16B are respectively a plan view of the semiconductor photocathode shown in FIG. 15 and a cross-sectional view thereof taken along line A–A' in FIG. 16A. Here, in order to explain the configuration of this semiconductor photocathode in a plain manner, FIG. 16A does not depict the activation layer 40 shown in FIG. 16B. In this semiconductor photocathode, lead electrodes 80*a*' and 80*b*' are respectively connected to the surface electrodes 80*a* and 80*b* shown in FIG. 14. The terminating end portion of the lead electrode 80*a*' constitutes a terminal for applying a potential to the surface electrode 80*a*, whereas the terminating end portion of the lead electrode 80*b*' constitutes a terminal for applying a potential to the surface electrode 80*b*. Since the lead electrodes are disposed between the row of surface electrodes 80*a* and 80*b* and the row of surface electrodes 80*c* and 80*d*, the lead electrode 80*a*' or 80*b*' does not obstruct the passage of the electron emitted from the activation layer 40. Here, the materials constituting the other elements (10, 20, 30, 40, 60, and 70) and dopant concentrations therein are the same as those shown in FIG. 14.

(Seventh Embodiment)

Figure 17A:
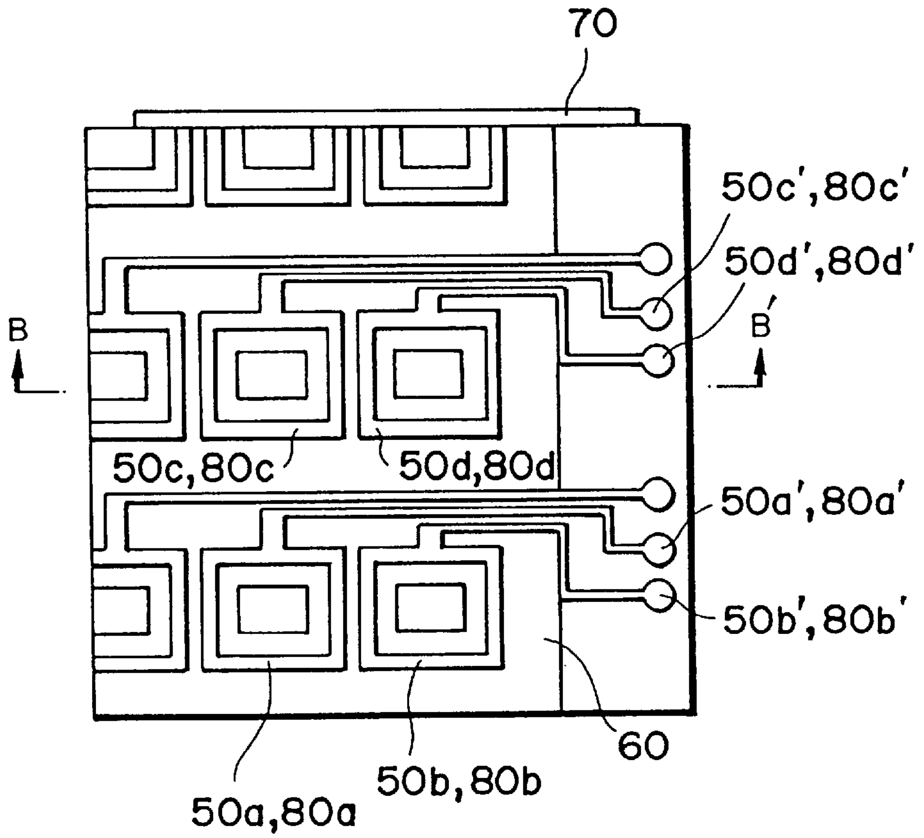
FIGS. 17A and 17B are respectively a plan view of a semiconductor photocathode in accordance with a seventh embodiment and a cross-sectional view thereof taken along line B–B' in FIG. 17A.
Figure 17B:
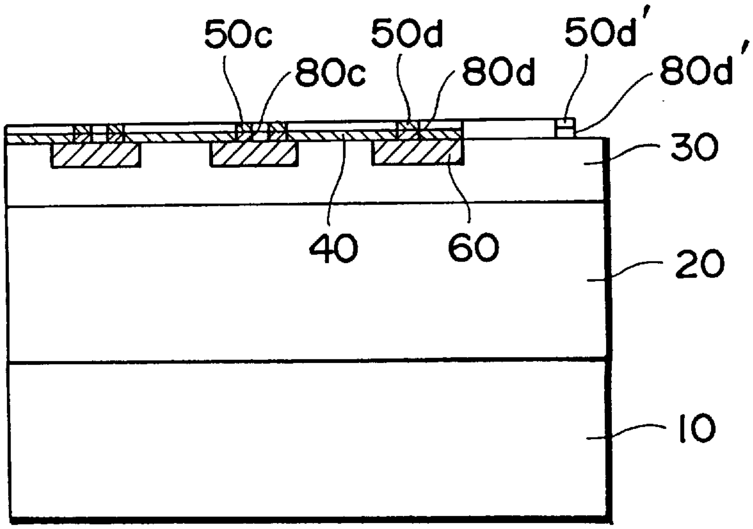

In the following, a seventh embodiment of the present invention will be explained. FIGS. 17A and 17B are respectively a plan view of the semiconductor photocathode in accordance with this embodiment and a cross-sectional view thereof taken along line B–B' in FIG. 17A. Here, in order to explain the configuration of this semiconductor photocathode in a plain manner, FIG. 17A does not depict the activation layer 40 shown in FIG. 17B.

In this semiconductor photocathode, the position of the semiconductor section 60, positions of the contact layers 50*a* and 50*b*, and positions of the surface electrodes 80*a* and 80*b* in the semiconductor photocathode shown in FIGS. 15, 16A, and 16B are changed. The semiconductor section 60 is embedded in the second semiconductor layer 30. The contact layers 50*a* to 50*d* are directly formed on the semiconductor section 60. The activation layer 40 is formed on the second semiconductor layer 30 within the opening of each of the contact layers 50*a* to 50*d*. While the electrons can independently be emitted from the respective contact layers 50*a* to 50*d*, thus configured semiconductor photocathode is advantageous in that its manufacturing method is simple as explained with reference to FIG. 10. Here, the materials constituting the other elements (10, 20, 30, 40, 50*a*, 50*b*, 60, 70, 80*a*, 80*b*) and dopant concentrations therein are the same as those shown in FIG. 1.

(Eighth Embodiment)

Figure 18A:
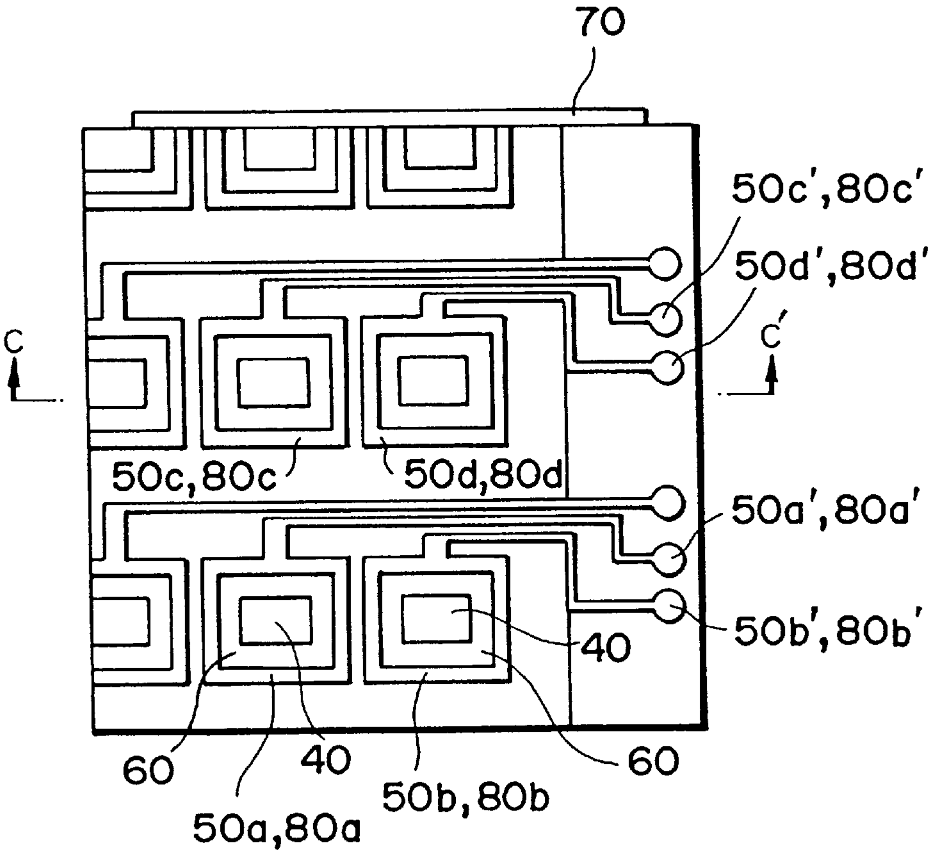
FIGS. 18A and 18B are respectively a plan view of a semiconductor photocathode in accordance with an eighth embodiment and a cross-sectional view thereof taken along line C–C' in FIG. 18A.
Figure 18B:
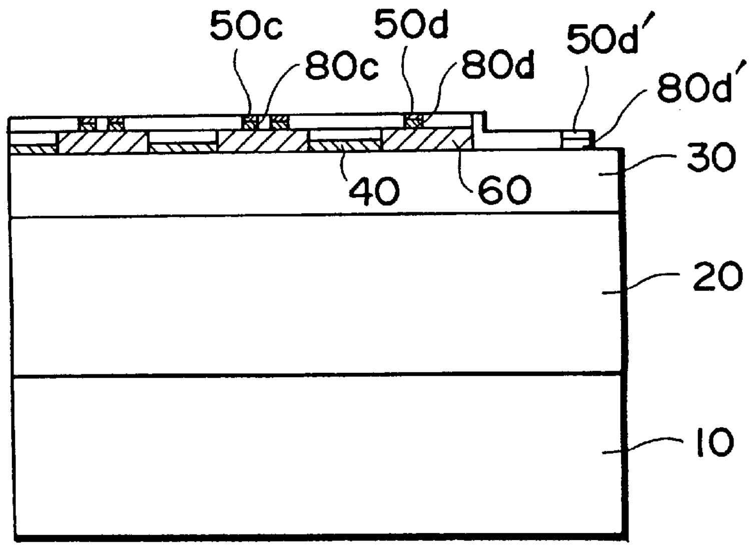

In the following, an eighth embodiment of the present invention will be explained. FIGS. 18A and 18B are respectively a plan view of the semiconductor photocathode in accordance with this embodiment and a cross-sectional view thereof taken along line C–C' in FIG. 18A. Here, in order to explain the configuration of this semiconductor photocathode in a plain manner, FIG. 18A does not depict the activation layer 40 shown in FIG. 18B.

In this semiconductor photocathode, the position of the semiconductor section 60, positions of the contact layers 50*a* and 50*b*, and positions of the surface electrodes 80*a* and 80*b* in the semiconductor photocathode shown in FIGS. 15, 16A, and 16B are changed. The semiconductor section 60 is embedded in the second semiconductor layer 30. The contact layers 50*a* to 50*d* are directly formed on the semiconductor section 60. The activation layer 40 is formed on the second semiconductor layer 30 within the opening of each of the contact layers 50*a* to 50*d*. While the electrons can independently be emitted from the respective pixels 50*a* to 50*d* as potentials are given to their corresponding surface electrodes 80*a* to 80*d*, thus configured semiconductor photocathode is advantageous in that its manufacturing method is simple as explained with reference to FIG. 12. Here, the materials constituting the other elements (10, 20, 30, 40, 50*a*, 50*b*, 60, 70, 80*a*, 80*b*) and dopant concentrations therein are the same as those shown in FIG. 1.

In the following, the electron emission control in the semiconductor photocathode shown in FIGS. 15, 16A, and 16B will be explained. Namely, explained hereinafter are "charge mode" in which an electron is charged into the semiconductor photocathode as light is incident thereon, "emission mode" in which this electron is emitted, and "absorption mode" in which the electron charged in the semiconductor photocathode is absorbed into a conductor attached to the semiconductor photocathode as a voltage is externally applied to the semiconductor section.

(Charge Mode)

Figure 19A:
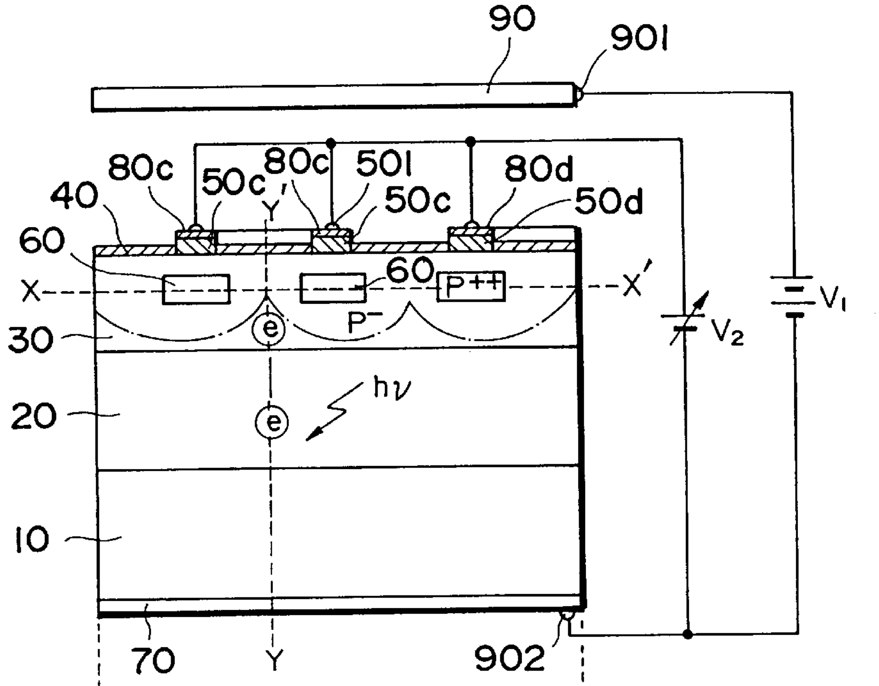
FIG. 19A is a cross-sectional view of a semiconductor photocathode and an anode.

FIG. 19A is a cross-sectional view of a semiconductor photocathode apparatus in which the anode 90 is connected to the semiconductor photocathode shown in FIGS. 15, 16A, and 16B. In this drawing, the electrode 70 is attached to the semiconductor substrate 10, whereas numerals 501, 901, and 902 refer to ohmic electrodes. As a power supply $V_1$ is connected between the electrode 70 and the anode 90, the potential of the anode 90 is higher than that of the electrode 70 by $V_1$ (volt). As a power supply $V_2$ is connected between the electrode 70 and each of the surface electrodes 80*c* and 80*d*, the potential of each of the surface electrodes 80*c* and 80*d* is higher than that of the electrode 70 by $V_2$ (volt). The potential $V_2$ is lower than the potential $V_1$, and the voltage source $V_2$ is variable. Here, it is assumed that the surface electrodes 80*c* and 80*d* are connected to each other, and a common potential is applied thereto.

Figure 19B:
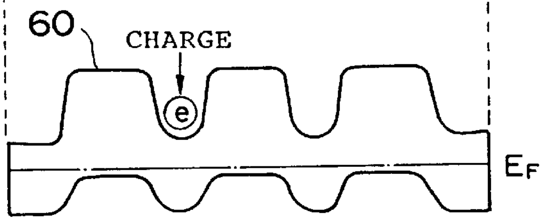
FIG. 19B is an energy band chart taken along line X–X' in FIG. 19A.

FIG. 19B is an energy band chart of the semiconductor photocathode taken along line X–X' in FIG. 19A ($V_2$=0 to 1 V). An electron e generated in the first semiconductor layer 20 as light hν is made incident thereon enters the second semiconductor layer 30 due to the force in the electric field within the first semiconductor layer 20 or diffusion. The area above (in the drawing) the chain line in FIG. 19A is a depletion region which is formed by the difference in concentration between the semiconductor section 60 and the second semiconductor layer 30. Accordingly, the passage of electron from the first semiconductor layer 20 toward the activation layer 40 is cut by this depletion region (pinch-off state).

Figure 19C:
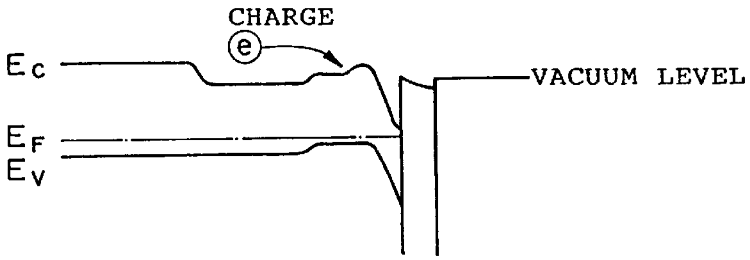
FIGS. 19C and 19D are energy band charts taken along line Y–Y' in FIG. 19A respectively corresponding to the time of electron charging and the time of electron emission.

FIG. 19C is an energy band chart of the semiconductor photocathode taken along line Y–Y' in FIG. 19A ($V_2$=0 to 1 V). As shown in FIGS. 19B and 19C, the electron e generated in the first semiconductor layer 20 is charged into the second semiconductor layer 30.

(Emission Mode)

Figure 19D:
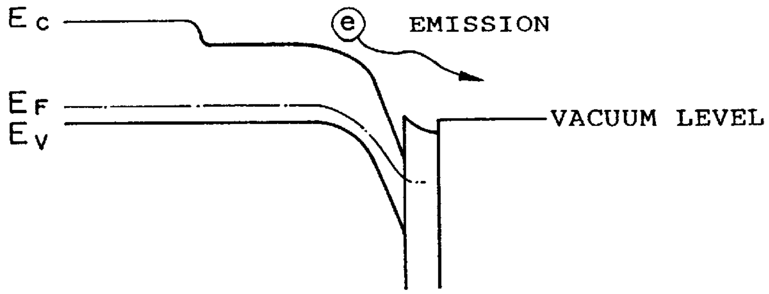

FIG. 19D is an energy band chart of the semiconductor photocathode taken along line X–X' in FIG. 19A ($V_2$=2 to several ten V). Thus, as a voltage of 2 to several ten V is applied between the surface electrode 80c and the electrode 70, the electron e charged in the second semiconductor layer 30 is emitted from the semiconductor photocathode.

Figure 20:
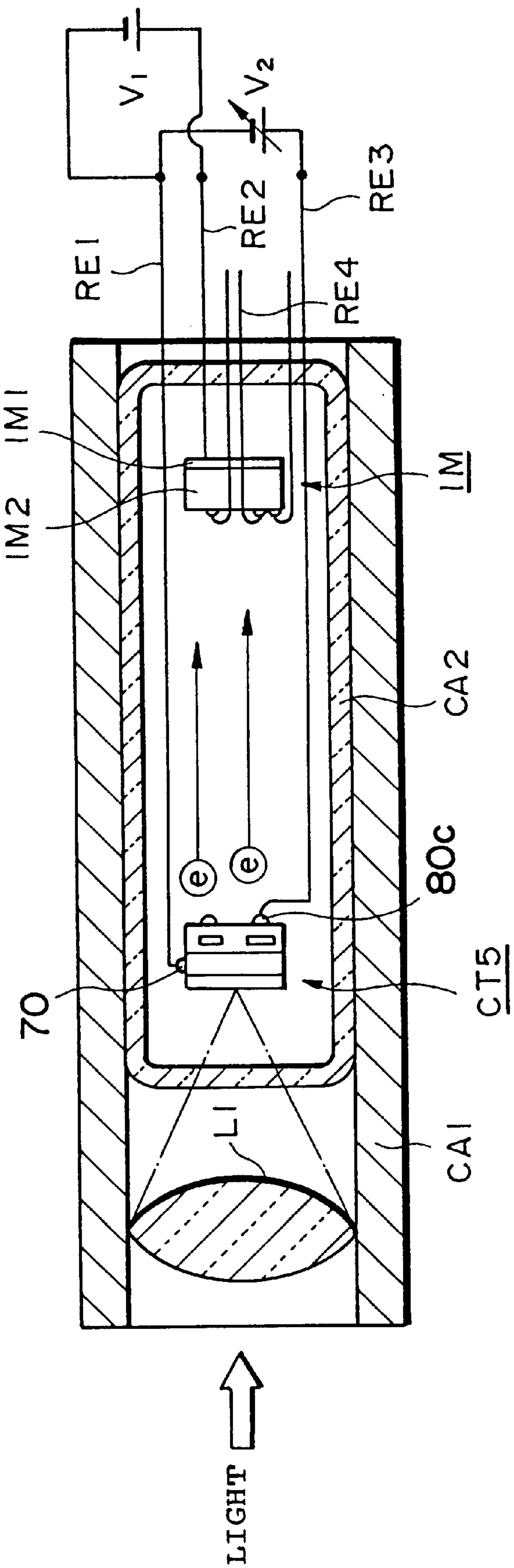
FIG. 20 is a cross-sectional view showing a semiconductor photocathode apparatus in which a semiconductor photocathode CT5 is implemented.

FIG. 20 is a cross-sectional view of a semiconductor photocathode apparatus using the semiconductor photocathode shown in FIGS. 15, 16A, and 16B. Fitted in the inner wall of a cylindrical outer case CA1 constituted by a light-shielding material is a sealed container (inner case) CA2 made of a transparent material. A lens L1 is secured to the outer case CA1 near its opening. The light entering this semiconductor photocathode apparatus from the outside is converged by the lens L1 so as to form an image on a semiconductor photocathode CT5 disposed within the sealed container CA2. The voltage source $V_2$ is connected between the electrode 70 and lead electrode 80c of the semiconductor photocathode CT5. Also disposed in the sealed container CA2 is a two-dimensional image sensor IM which is sensitive to the electron incident thereon. The two-dimensional image sensor IM is a device for taking out, by way of a lead RE4, the electron received from the surface thereof. The two-dimensional image sensor IM comprises a layer IM2 which is sensitive to the incident electron and a back contact IM1 disposed on the rear side of the layer IM2, whereas a lead RE2 is connected to the back contact IM1. Since the voltage source $V_1$ is connected between the lead RE2 and a lead RE1, which is connected to the electrode 70, the electron emitted from the semiconductor photocathode CT5 advances toward the anode IM. Here, the pressure within the sealed container, which is lower than the atmospheric pressure, is specifically not higher than $10^{-5}$ torr or preferably not higher than $10^{-10}$ torr. Thus, the light fed into the semiconductor photocathode apparatus (weak-light detection tube) from the left side of the drawing can be detected as an electric signal. Here, a microchannel plate may be disposed between the cathode CT5 and the anode IM.

As explained in the foregoing, the semiconductor photocathode in accordance with the present invention can be applied to instruments for detecting light. Though an imaging tube using the semiconductor photocathode is explained above, the present invention is also applicable to electron multiplier and streak camera. Namely, in the apparatus utilizing the semiconductor photocathode, a microchannel plate, dynode, or secondary electron multiplying section may be disposed between the anode and the cathode, and a deflecting electrode for deflecting the orbit of the electron may be disposed between the anode and the cathode. Further, a fluorescent member coated with fluorescent paint or a fluorescent plate containing a fluorescent material may be used as the anode.

As explained in the foregoing, in the present invention, since the semiconductor section is disposed within or on the surface of the second semiconductor layer, the electron runs toward the opening of the contact layer and surface electrode. Since the third semiconductor layer is formed within the opening, the electron is introduced into this third semiconductor layer. Thus, as the electron is emitted into the vacuum from the third semiconductor layer bypassing the contact layer, the ratio at which the electron is absorbed by the contact layer decreases. Accordingly, with respect to the incident light energy, the amount of electrons collected by the anode increases, whereby the semiconductor photocathode apparatus using such a semiconductor can maintain a high detection sensitivity. Also, as the semiconductor section is provided, structural pixel separation becomes unnecessary at an open area ratio of 100%, and signal modulation is enabled.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 133789/1996 filed on May 28, 1996 is hereby incorporated by reference.

What is claimed is:

1. A semiconductor photocathode which, with an externally applied voltage, accelerates and emits an electron generated in response to light incident, said semiconductor photocathode comprising:

a first semiconductor layer of p-type;

a second semiconductor layer of p-type formed on said first semiconductor layer;

a contact layer formed over an exposed surface of said second semiconductor layer with an opening in a surface thereof to provide a pn junction with said second semiconductor layer;

a surface electrode disposed on and in ohmic contact with said contact layer;

a third semiconductor layer formed within the opening of said contact layer to cover a remaining surface of the second semiconductor layer and having a lower work function than said second semiconductor layer; and a semiconductor section disposed within said second semiconductor layer directly below said contact layer and having a wider energy band gap than said second semiconductor layer.

2. A semiconductor photocathode according to claim 1, wherein said semiconductor section has a toroidal portion with which an area enclosed is smaller than the area within the opening of said contact layer.

3. A semiconductor photocathode according to claim 1, wherein said semiconductor section has a mesh form.

4. A semiconductor photocathode according to claim 3, said second semiconductor layer has a first graded layer near an interface thereof with said first semiconductor layer, said first graded layer having an energy band gap whose width is between the width of energy band gap of a region on the third semiconductor layer side in said second semiconductor layer and the width of energy band gap of said first semiconductor layer.

5. A semiconductor photocathode according to claim 1, wherein said semiconductor section includes a semiconductor portion arranged in a stripe form.

6. A semiconductor photocathode which, with an externally applied voltage, accelerates and emits an electron generated in response to light incident, said semiconductor photocathode comprising:

a first semiconductor layer of p-type;

a second semiconductor layer of p-type formed on said first semiconductor layer;

a semiconductor section formed on said second semiconductor layer and having a wider energy band gap than said second semiconductor layer;

a contact layer covering a surface of said semiconductor section with an opening in a surface thereof to provide a pn junction with said semiconductor section;

a surface electrode disposed on and in ohmic contact with said contact layer; and a third semiconductor layer formed on an exposed surface of said second semiconductor layer and has a lower work function than said second semiconductor layer.

7. A semiconductor photocathode according to claim 6, wherein said semiconductor section has a toroidal portion with which an area enclosed is smaller than the area within the opening of said contact layer.

8. A semiconductor photocathode according to claim 6, wherein said semiconductor section has a mesh form.

9. A semiconductor photocathode according to claim 6, wherein said semiconductor section includes a semiconductor portion arranged in a stripe form.

10. A semiconductor photocathode apparatus comprising a semiconductor photocathode and an anode within a sealed container whose inside is kept at a lower pressure than the atmospheric pressure, said semiconductor photocathode comprising:

a semiconductor substrate;

a first semiconductor layer of p-type formed on said semiconductor substrate;

a second semiconductor layer of p-type formed on said first semiconductor layer;

a contact layer formed an exposed surface of said second semiconductor layer with an opening in the surface thereof to provide a pn junction with said second semiconductor layer;

a surface electrode disposed on and in ohmic contact with said contact layer;

a third semiconductor layer formed within the opening of said contact layer to cover a remaining exposed surface of said second semiconductor layer and having a lower work function than said second semiconductor layer;

a semiconductor section disposed within said second semiconductor layer directly below said contact layer and having a wider energy band gap than said second semiconductor layer;

a first connecting pin electrically connected to said surface electrode and penetrating through said sealed container; and a second connecting pin electrically connected to said semiconductor substrate or first semiconductor layer and penetrating through said sealed container; and wherein said anode has a third connecting pin electrically connected to said anode and penetrating through said sealed container.

11. A semiconductor photocathode apparatus according to claim 10, wherein said first semiconductor layer includes a second graded layer near an interface thereof with said semiconductor substrate, said second graded layer having an energy band gap whose width is between the width of energy band gap of a region on the second semiconductor layer side in said first semiconductor layer and the width of energy band gap of said semiconductor substrate.

12. A semiconductor photocathode apparatus according to claim 10, further comprising an electron multiplier disposed between said semiconductor photocathode and said anode.

13. A semiconductor photocathode apparatus according to claim 10, wherein said anode includes a member containing a fluorescent material.

14. A semiconductor photocathode apparatus comprising a semiconductor photocathode and an anode within a sealed container whose inside is kept at a lower pressure than the atmospheric pressure, said semiconductor photocathode comprising:

a semiconductor substrate;

a first semiconductor layer of p-type formed on said semiconductor substrate;

a second semiconductor layer of p-type formed on said first semiconductor layer;

a contact layer disposed between said second semiconductor layer and said anode;

a surface electrode disposed on and in ohmic contact with said contact layer;

a third semiconductor layer disposed between said second semiconductor layer and said anode and having a lower work function than said second semiconductor layer;

a semiconductor section disposed within said second semiconductor layer directly below said contact layer to provide a pn junction with said contact layer and having a wider energy band gap than said second semiconductor layer;

a first connecting pin electrically connected to said surface electrode and penetrating through said sealed container; and a second connecting pin electrically connected to said semiconductor substrate or first semiconductor layer and penetrating through said sealed container; and wherein said anode has a third connecting pin electrically connected to said anode and penetrating through said sealed container.

* * * * *